United States Patent
Takahata

(10) Patent No.: US 7,589,361 B2
(45) Date of Patent: Sep. 15, 2009

(54) STANDARD CELLS, LSI WITH THE STANDARD CELLS AND LAYOUT DESIGN METHOD FOR THE STANDARD CELLS

(75) Inventor: Atsushi Takahata, Osaka (JP)

(73) Assignee: Panasonic Corporation, Osaka (JP)

( * ) Notice: Subject to any disclaimer, the term of this patent is extended or adjusted under 35 U.S.C. 154(b) by 276 days.

(21) Appl. No.: 11/224,042

(22) Filed: Sep. 13, 2005

(65) Prior Publication Data

US 2006/0054935 A1 Mar. 16, 2006

(30) Foreign Application Priority Data

Sep. 16, 2004 (JP) .............................. 2004-269544

(51) Int. Cl.
*H01L 27/10* (2006.01)
(52) U.S. Cl. ..................... 257/206; 257/401; 257/532; 257/E27.013; 257/E27.016; 257/E29.026
(58) Field of Classification Search .................. 257/206, 257/379, 401, 528, 532, E27.013, E27.016, 257/E29.026
See application file for complete search history.

(56) References Cited

U.S. PATENT DOCUMENTS 6,459,331 B1 * 10/2002 Takeuchi et al. ............ 327/554

FOREIGN PATENT DOCUMENTS

JP 2002-110798 A 4/2002

* cited by examiner

*Primary Examiner*—Matthew E Warren
(74) *Attorney, Agent, or Firm*—McDermott Will & Emery LLP

(57) ABSTRACT

In automatic placing and routing, a standard cell 101 is composed of a P-channel transistor region 102 and an N-channel transistor region 103. The P-channel transistor region 102 has a P-channel functional transistor forming region 104, and the N-channel transistor region 103 has an N-channel functional transistor forming region 105. In a space region of the N-channel transistor region 103 other than the N-channel functional transistor forming region 105, a power source capacitor forming region 106 is formed at a portion of the P-channel transistor region 102 opposing the P-channel functional transistor forming region 104. In this region, a power source capacitor is formed to suppress the IR-Drop of a power source wiring line.

12 Claims, 14 Drawing Sheets

US 7,589,361 B2

STANDARD CELLS, LSI WITH THE STANDARD CELLS AND LAYOUT DESIGN METHOD FOR THE STANDARD CELLS

CROSS REFERENCE TO RELATED APPLICATIONS

This Non-provisional application claims priority under 35 U.S.C.§119(a) on Patent Application No. 2004-269544 filed in Japan on Sep. 16, 2004, the entire contents of which are hereby incorporated by reference.

BACKGROUND OF THE INVENTION

The present invention relates to a semiconductor integrated circuit and a standard cell for use in a semiconductor integrated circuit. More particularly, the present invention relates to a standard cell comprising a power source capacitor, a semiconductor integrated circuit comprising the standard cells, and a layout design method for the standard cells.

For recent large-scale semiconductor integrated circuits, for example, an automatic placing and routing technique employing standard cells is widely used in order to design a high-performance semiconductor integrated circuit having an improved operating frequency, low power consumption, and the like in a short period of time. Examples of the standard cell include logic cells (e.g., an inverter circuit, a NAND circuit, an OR circuit, etc.), sequential cells (e.g., a flip-flop circuit, a latch circuit, etc.), and the like. A transistor which is used to construct such a standard cell circuit is herein referred to as a functional transistor.

Next, an exemplary conventional method of designing a semiconductor integrated circuit by automatic placing and routing is illustrated in FIG. 13. In the automatic placing and routing, step S1301 of producing a layout of standard cells which may be used in a netlist is previously performed. The standard cell layout producing step S1301 further includes producing a cell (hereinafter referred to as a power source capacitor cell) which includes only a power source capacitance component (hereinafter referred to as a power source capacitor) with respect to a power source wiring line, but not a functional transistor for a standard cell.

In addition to step S1301, a netlist required to design a semiconductor integrated circuit is logically synthesized (step S1302) from a resistor transfer level (RTL) which is functionally described, using timing constraint information and power consumption information obtained in step S1303. In this case, mapping and optimization of a netlist are performed with respect to cells (e.g.,-a standard cell, a customized cell, etc.). As a standard cell used in this mapping, the standard cell produced in step S1301 is selected. Based on the netlist thus obtained in the logic synthesis step S1302, the standard cells are arranged on a mask (step S1304). Next, in wiring step S1305, wiring is performed between the standard cells to satisfy a connection relationship between each standard cell. Step S1304 and step S1305 are repeated until meeting a specification (e.g., timing, power consumption, etc.). Finally, in step S1306, a space region between each standard cell provided is detected, and a power source capacitor cell is inserted into the detected space region (step S1307). Thus, a semiconductor integrated circuit is completed (step S1308).

Next, a conventional IR-Drop reducing technique will be described. Concerning a standard cell used in automatic placing and routing, the timing of the standard cell can be uniquely determined by applying a constant voltage required for an operation from a power source wiring line which supplies a power source potential when a functional transistor in the standard cell is operated. However, such a power source wiring line has a resistance component, and the voltage of the power source wiring line is transiently changed when a current flows through the functional transistor of the standard cell. Therefore, the applied voltage cannot be always kept constant (hereinafter, such a change is referred to as an IR-Drop, and an instantaneous maximum IR-Drop is represented by a peak IR-Drop). Particularly, when standard cells which are operated with the same timing are cascaded on the same power source wiring line in a semiconductor integrated circuit, the amount of current flowing into these standard cells from the same power source wiring line increases, resulting in a significant IR-Drop. Therefore, the timings of standard cells in the semiconductor integrated circuit are not uniquely determined, highly likely leading to a logically erroneous operation. In this situation, it is a known technique to connect a power source capacitor to a power source wiring line used in a semiconductor integrated circuit to suppress an IR-Drop in order to suppress a sudden IR-Drop in the semiconductor integrated circuit.

Next, a power source capacitor cell used in automatic placing and routing will be described. In automatic placing and routing, the following method is widely used: a power source capacitor cell is previously prepared as a standard cell for use in a semiconductor integrated circuit, and the power source capacitor cell is inserted into a space region in which no standard cell of the semiconductor integrated circuit is provided. However, a standard cell which is likely to logically erroneously operate due to an IR-Drop significantly occurs when a plurality of standard cells are cascaded on the same power source wiring line as described above. Such a standard cell which is likely to logically erroneously operate is often present on a signal path which requires a most strict timing of a semiconductor integrated circuit (hereinafter referred to as a critical path). Particularly, on the critical path, standard cells are arranged as closely as possible to each other in order to reduce the load of a wiring line connecting between each standard cell. A power source capacitor cell required to suppress an IR-Drop in such a densely arranged portion needs to be inserted into the region in which the standard cells are densely arranged. Therefore, in a semiconductor integrated circuit in which a standard cell and a power source capacitor cell are arranged, the area of the semiconductor integrated circuit is increased by an area in which the power source capacitor cell is placed. There is also a conventional technique to calculate the current amount of standard cells and insert a minimally required number of power source capacitor cells. Also in this technique, an area in which a power source capacitor cell is inserted needs to be secured, so that the area of the semiconductor integrated circuit is increased by the area of the power source capacitor cell.

Next, a conventional power source capacitor composed of a MOS transistor will be described with reference to FIG. 14A to 14D. FIG. 14A illustrates a conventional power source capacitor employing an N-channel transistor. In FIG. 14A, 1401 indicates a power source wiring line through which a power source potential is supplied, and 1402 indicates a power source wiring line through which a ground potential is supplied. The power source capacitor is constructed to provide a capacitor between the power source wiring-lines 1401 and 1402. Further, 1403 indicates a contact, 1404 indicates a gate electrode, and 1405 indicates a drain region or a source region of the power source capacitor. FIG. 14B is a cross-sectional view of the power source capacitor, taken along line 14a-14a in an N-channel transistor producible region of FIG. 14A. In FIG. 14B, the gate electrode 1404 of the power source capacitor is connected via the contact 1403 to the power source wiring line 1401 through which the power source potential is supplied, and the drain region or source region 1405 of the power source capacitor is connected via the contact 1403 to the power source wiring line 1402 through which the ground potential is supplied. With such a connection to the power source potential or the ground potential, a channel region 1407 is formed. A first substrate 1409 is connected to the ground potential, and a gate oxide film 1406, which is an insulator, is provided between the gate electrode 1404 and the channel region 1407, so that a power source capacitor 1408 is formed between the gate electrode 1404 and the channel region 1407.

FIG. 14C illustrates a conventional power source capacitor employing a P-channel transistor. In FIG. 14C, 1401 indicates a power source wiring line through which a power source potential is supplied, and 1402 indicates a power source wiring line through which a ground potential is supplied. The power source capacitor is constructed to provide a capacitor with respect to the power source wiring lines 1401 and 1402. Further, 1403 indicates a contact, 1404 indicates a gate electrode, and 1405 indicates a drain region or a source region of the power source capacitor. FIG. 14D is a cross-sectional view of the power source capacitor, taken along line 14*b*-14*b* in a P-channel transistor producible region of FIG. 14C. In FIG. 14D, the gate electrode 1404 of the power source capacitor is connected via the contact 1403 to the power source wiring line 1402 through which the ground potential is supplied, and the drain region or the source region 1405 of the power source capacitor is connected via the contact 1403 to the power source wiring line 1401 through which the power source potential is supplied. With such a connection to the power source potential or the ground potential, a channel region 1407 is formed. A substrate 1410 is connected to the ground potential, and a gate oxide film 1406, which is an insulator, is provided between the gate electrode 1404 and the channel region 1407, so that a power source capacitor 1408 is formed between the gate electrode 1404 and the channel region 1407.

Among the above-described conventional techniques, JP 2002-110798 A describes a technique for a semiconductor device and a layout method which employ a power source capacitor, the technique being most similar to the present invention. Hereinafter, a standard cell according to this conventional technique will be described with reference to FIGS. 15A and 15B. In FIG. 15A, 1501 indicates a standard cell, 1502 indicates a P-channel functional transistor region, 1503 indicates an N-channel functional transistor region, 1504 indicates a power source capacitor forming region, 1505 indicates a power source wiring line through which a power source potential is supplied, 1506 indicates a power source wiring line through which a ground potential is supplied, 1507 indicates a left-hand end portion of the functional transistor region 1502, 1508 indicates a left-hand end portion of the functional transistor 1503, 1509 indicates a first power source wiring line resistance, and 1510 indicates a power source wiring line resistance. A power source capacitor is formed in the power source capacitor forming region 1504. In this case, when a functional transistor is operated as described above, since a current flows through the functional transistor, an IR-Drop occurs in the standard 1501 cell due to a resistance possessed by a power source wiring line. Specifically, when a power source capacitor is formed in the power source capacitor forming region 1504 of the standard cell 1501, a current flows from the power source capacitor to the functional transistor 1502 or the functional transistor 1503 via the power source wiring line 1505 through which the power source potential of the standard cell 1501 is supplied or the power source wiring line 1506 through which the ground potential is supplied.

With such a structure, a power source capacitor cell (the power source capacitor forming region 1504) having a power source capacitor can be provided between standard cells for use in a semiconductor integrated circuit, thereby making it possible to reduce the IR-Drop of the standard cell. However, a current path from the power source capacitor which is formed in the power source capacitor forming region 1504 adjacent to the standard cell, to the left-hand end portion 1508 of the functional transistor region 1503 includes the power source wiring line resistance 1509, resulting in a reduction in current from the power source capacitor to the functional transistor.

FIG. 15B illustrates a conventional semiconductor integrated circuit in which standard cells are provided. 1511 indicates a semiconductor integrated circuit, 1512*a* to 1512*f* indicate functional transistor regions, 1513 indicates power source capacitor forming regions, 1514*a* to 1514*d* indicate power source capacitor unformed regions, and 1515 to 1520 indicate standard cells. In the semiconductor integrated circuit 1511, the standard cell 1515 has a functional transistor in the functional transistor region 1512*a* and a power source capacitor in the power source capacitor forming region 1513, and the power source capacitor has an effect of reducing an IR-Drop with respect to not only the functional transistor region 1512*a* in the standard cell 1515 but also the functional transistor region 1512*b* in the standard cell 1516.

A size of a standard cell will be described. Concerning a standard cell for use in automatic placing and routing, in order to facilitate connection of a power source wiring line or the like between standard cells, at least one of a size in a height direction and a size in a horizontal direction of the standard cell is fixed, while the other size is arbitrarily designed. It is here assumed that the size in the height direction of the standard cell is fixed, while the size in the horizontal direction is variable.

Next, a size of a semiconductor integrated circuit in which standard cells are provided will be described. A size in a horizontal direction of the semiconductor integrated circuit in which the standard cells are provided can be specified with positions of standard cells placed at a left-hand end and a right-hand end of the semiconductor integrated circuit. The size in the horizontal direction of a standard cell can be specified with a region in which a functional transistor is formed. Therefore, the size in the horizontal direction of the semiconductor integrated circuit in which the standard cells are provided can be specified with regions in which functional transistors are formed in the standard cells placed at the left-hand end and the right-hand end of the semiconductor integrated circuit. Also, the size in the vertical direction of the semiconductor integrated circuit in which the standard cells are provided is determined, depending on the number of standard cells arranged in the vertical direction. When it is assumed that the standard cell has a fixed size in the height direction, the size in the height direction of the semiconductor integrated circuit in which the standard cell are provided is uniquely determined.

However, in the conventional standard cell 1501 of FIG. 15A, a portion of the standard cell 1501 which provides the functional transistor 1502 and the functional transistor 1503 is separated from a portion of the standard cell 1501 which provides the power source capacitor forming region 1504. Therefore, when a power source capacitor is constructed in the power source capacitor forming region 1504 of the standard cell 1501, the area of the standard cell is increased by a region in which the power source capacitor is formed.

Further, the conventional structure is equivalent to a structure in which the power source capacitor in the power source capacitor forming region 1504 is provided outside the standard cell. Therefore, for example, when the power source wiring line resistance 1509 from the power source capacitor in the power source capacitor forming region 1504 to the left-hand end portion 1507 of the functional transistor region 1502 in the standard cell 1501 is compared with the power source wiring line resistance 1510 from the power source capacitor in the power source capacitor forming region 1504 to the left-hand end portion 1508 of the functional transistor region 1503 in the standard cell 1501, there is a space region in which no transistor is formed between the functional transistor region 1503 and the power source capacitor forming region 1504, as compared to a region between the functional transistor region 1502 and the power source capacitor forming region 1504. Therefore, the wiring line resistance is wastefully increased by the space region. In other words, an effect of reducing the peak IR-Drop of the left-hand end portion 1508 of the functional transistor region 1503 is reduced.

In addition, when the standard cell which includes a power source capacitor is used in a semiconductor integrated circuit as in conventional techniques, the overall area of the semiconductor integrated circuit is increased.

SUMMARY OF THE INVENTION

An object of the present invention is to reduce a distance from a power source capacitor element to a P-channel functional transistor or an N-channel functional transistor, thereby reducing a resistance which is responsible for IR-Drop. A second object of the present invention is to avoid an increase in the areas of a standard cell and a semiconductor integrated circuit due to formation of a power source capacitor.

To achieve the first and second objects, the present invention provides a standard cell, a semiconductor integrated circuit comprising the standard cell, and a method of producing a layout of the standard cells, in which a space region occurring between functional transistors in the standard cell is detected in LSI design using automatic placing and routing, and a power source capacitor is constructed in the space region of the standard cell. Thereby, a separate power source capacitor forming region is no longer required, and a size of the standard cell is the same as when the power source capacitor is not constructed.

The present invention also provides a standard cell in which a power source capacitor included in the standard cell is composed of a MOS transistor, and a substrate potential is used as a reverse potential which is supplied to a gate electrode of the MOS transistor.

The present invention also provides a standard cell which includes a power source capacitor in which a source region or a drain-region of a MOS transistor constituting the power source capacitor and a source region of a functional transistor connected to a power source wiring line are provided as a common region.

The present invention also provides a semiconductor integrated circuit designed using automatic placing and routing in which, after standard cells are arranged, a power source capacitor is constructed in the semiconductor integrated circuit, and a size of the semiconductor integrated circuit is the same as when the power source capacitor is not constructed.

Specifically, a standard cell of the present invention is a standard cell for use in LSI design using automatic placing and routing, having a P-channel transistor region and an N-channel transistor region, in which the P-channel transistor region has a P-channel functional transistor forming region in which a P-channel functional transistor is formed, and the N-channel transistor region has an N-channel functional transistor forming region in which an N-channel functional transistor is formed, and a power source capacitor element is formed in at least one of a region opposing the P-channel functional transistor forming region and present in the N-channel transistor region but other than the N-channel functional transistor forming region, and a region opposing the N-channel functional transistor region and present in the P-channel transistor region but other than the P-channel functional transistor forming region.

A standard cell of the present invention is a standard cell for use in LSI design using automatic placing and routing, having a P-channel transistor region and an N-channel transistor region, in which the P-channel transistor region has a P-channel functional transistor forming region in which a P-channel functional transistor is formed, and the N-channel transistor region has an N-channel functional transistor forming region in which an N-channel functional transistor is formed, and a power source capacitor element is formed in a region surrounded by the P-channel functional transistor forming region and the N-channel functional transistor forming region.

A standard cell of the present invention is a standard cell for use in LSI design using automatic placing and routing, having a P-channel transistor region and an N-channel transistor region, in which the P-channel transistor region has a P-channel functional transistor forming region in which a P-channel functional transistor is formed, and the N-channel transistor region has an N-channel functional transistor forming region in which an N-channel functional transistor is formed, and a power source capacitor element is formed in a region surrounded by the P-channel functional transistor forming region, the N-channel functional transistor forming region, and an end portion of the standard cell.

A standard cell of the present invention is a standard cell for use in LSI design using automatic placing and routing, having a P-channel transistor region and an N-channel transistor region, in which the P-channel transistor region has a P-channel functional transistor forming region in which a P-channel functional transistor is formed, and the N-channel transistor region has an N-channel functional transistor forming region in which an N-channel functional transistor is formed, and a power source capacitor element is formed in a space region other than a plurality of the functional transistor forming regions.

A standard cell of the present invention is a standard cell for use in LSI design using automatic placing and routing, having a P-channel transistor region and an N-channel transistor region, in which the P-channel transistor region has a P-channel functional transistor forming region in which a P-channel functional transistor is formed, and the N-channel transistor region has an N-channel functional transistor forming region in which an N-channel functional transistor is formed, the standard cell further has a substrate contact forming region in which a substrate contact is formed, and a power source capacitor element is formed in a region surrounded by the substrate contact forming region and at least one of the P-channel functional transistor forming region and the N-channel functional transistor forming region.

A standard cell of the present invention is a standard cell for use in LSI design using automatic placing and routing, having a P-channel transistor region and an N-channel transistor region, in which the P-channel transistor region has a P-channel functional transistor forming region in which a P-channel functional transistor is formed, and the N-channel transistor region has an N-channel functional transistor forming region in which an N-channel functional transistor is formed, the standard cell further has a substrate contact forming region in which a substrate contact is formed, and a power source capacitor element is formed in a region surrounded by the substrate contact forming region, at least one of the P-channel functional transistor forming region and the N-channel functional transistor forming region, and an end portion of the standard cell.

In an example of the standard cell of the present invention, the power source capacitor element is formed between a gate electrode of a P-channel or N-channel MOS transistor having the same structure as that of the functional transistor and a substrate thereof, and a potential reverse to the substrate potential is applied to the gate electrode.

In an example of the standard cell of the present invention, a potential of at least one of a source region and a drain region of the P-channel or N-channel MOS transistor included in the power source capacitor element is the same as the substrate potential.

In an example of the standard cell of the present invention, at least one of a source region and a drain region of the P-channel or N-channel MOS transistor included in the power source capacitor element and a source region of the P-channel or N-channel functional transistor are provided as a common region.

In an example of the standard cell of the present invention, at least one of connection wiring lines formed between a power source wiring line through which a power source potential or a ground potential is supplied to the standard cell and a gate electrode, a source electrode, and a drain electrode of a P-channel or N-channel MOS transistor included in the power source capacitor element and having the same structure as that of the functional transistor is provided perpendicular to the power source wiring line.

A semiconductor integrated circuit of the present invention is a semiconductor integrated circuit comprising a plurality of standard cells for use in LSI design using automatic placing and routing, each standard cell having a P-channel transistor region and an N-channel transistor region, in which the P-channel transistor region of each standard cell has a P-channel functional transistor forming region in which a P-channel functional transistor is formed, and the N-channel transistor region of each standard cell has an N-channel functional transistor forming region in which an N-channel functional transistor is formed, and at least one of the plurality of standard cells in which the P-channel or N-channel transistor regions oppose each other, comprises a power source capacitor element in a space region other than the P-channel or N-channel functional transistor forming regions in the P-channel or N-channel transistor regions.

In an example of the semiconductor integrated circuit of the present invention, the space region includes a space region other than the N-channel functional transistor forming region in the N-channel transistor region opposing the P-channel transistor region and a space region other than the P-channel functional transistor forming region in the P-channel transistor region opposing the N-channel transistor region, and the power source capacitor element is formed in at least one of the space regions.

In an example of the semiconductor integrated circuit of the present invention, a predetermined one of the plurality of standard cells has a substrate contact forming region in which a substrate contact is formed, and the power source capacitor element is formed in a region surrounded by the substrate contact forming region and the P-channel or N-channel functional transistor forming region.

In an example of the semiconductor integrated circuit of the present invention, a predetermined one of the plurality of standard cells has a substrate contact forming region in which a substrate contact is formed, and the power source capacitor element is formed in a region surrounded by the P-channel or N-channel functional transistor forming region and an end portion of the semiconductor integrated circuit.

In an example of the semiconductor integrated circuit of the present invention, a predetermined one of the plurality of standard cells has a substrate contact forming region in which a substrate contact is formed, and the power source capacitor element is formed in a region surrounded by the substrate contact forming region, the P-channel or N-channel functional transistor forming region, and an end portion of the semiconductor integrated circuit.

A standard cell layout producing method of the present invention is a method of producing a layout of standard cells for use in LSI design using automatic placing and routing, each standard cell having a P-channel transistor region having a P-channel functional transistor forming region in which a P-channel functional transistor is formed, and an N-channel transistor region having an N-channel functional transistor forming region in which an N-channel functional transistor is formed, the method comprising the steps of detecting, in the arranged standard cell, a space region in which a power source capacitor element can be formed and which is a region other than the P-channel and N-channel functional transistor forming regions, and forming the power source capacitor element in at least one of the space regions detected in the detecting step.

As described above, in the present invention, a power source capacitor element is formed in a space region of a standard cell other than a region in which a functional transistor is formed, thereby providing the power source capacitor element without avoiding an increase the area of the standard cell. In addition, the power source capacitor element can be provided in the vicinity of a functional transistor of the standard cell, and therefore, a power source wiring line resistance between the power source capacitor element and the functional transistor can be caused to be smaller than that of conventional techniques, thereby making it possible to effectively suppressing a peak IR-Drop.

Further, in the present invention, the source region of a functional transistor in a standard cell and the source or drain region of a MOS transistor in a power source capacitor element are provided as a common region, thereby making it possible to further reduce the area of the standard cell.

Furthermore, in the present invention, the above-described standard cell is applied to a semiconductor integrated circuit, thereby achieving a semiconductor integrated circuit in which a peak IR-Drop is reduced and there is not an increase in the area of the semiconductor integrated circuit. In addition, after standard cells composed of only functional transistors are arranged using automatic placing and routing, a power source capacitor element can be additionally formed in a region in which a functional transistor is not provided, without correction of the arrangement. Further, a power source capacitor element can be provided in the vicinity of a functional transistor in the semiconductor integrated circuit, thereby obtaining a smaller power source wiring line resistance between the power source capacitor and the functional transistor than that of conventional techniques. Therefore, it is possible to effectively suppress the peak IR-Drop of the semiconductor integrated circuit.

DESCRIPTION OF THE PREFERRED EMBODIMENTS

Hereinafter, embodiments of the present invention will be described with reference to the accompanying drawings.

FIRST EXAMPLE

FIG. 1 illustrates a standard cell according to a first example of the present invention. For the sake of simplicity, a power source wiring line and a signal wiring line in the standard cell will not be explained.

Firstly, a size of the standard cell will be described. Concerning standard cells for use in automatic placing and routing in LSI design, in order to facilitate connection of a power source wiring line or the like between the standard cells, at least one of a size in a height direction and a size in a horizontal direction of the standard cell is fixed, while the other size is arbitrarily designed. It is here assumed that the size in the height direction of the standard cell is fixed, while the size in the horizontal direction is variable.

Next, a size of a semiconductor integrated circuit in which standard cells are provided will be described. A size in a horizontal direction of the semiconductor integrated circuit in which the standard cells are provided can be specified with positions of standard cells placed at a left-hand end and a right-hand end of the semiconductor integrated circuit. The size in the horizontal direction of a standard cell can be specified with a region in which a functional transistor is formed. Therefore, the size in the horizontal direction of the semiconductor integrated circuit in which-the standard cells are provided can be specified with regions in which functional transistors are formed in the standard cells placed at the left-hand end and the right-hand end of the semiconductor integrated circuit. Also, a size in a vertical direction of the semiconductor integrated circuit in which the standard cell are provided is determined, depending on the number of standard cells arranged in the vertical direction. When it is assumed that the standard cell has a fixed size in the height direction, the size in the height direction of the semiconductor integrated circuit in which the standard cells are provided is uniquely determined.

Figure 1A:
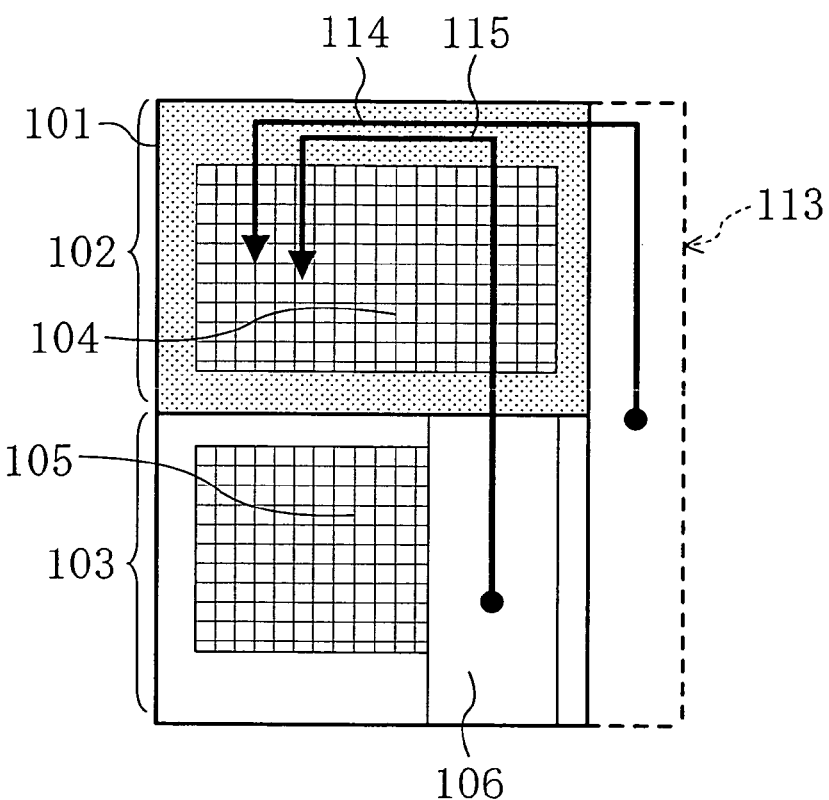
FIG. 1A is a structural diagram illustrating a standard cell according to a first example of the present invention in which a power source capacitor is formed in an N-channel transistor region.
Figure 1B:
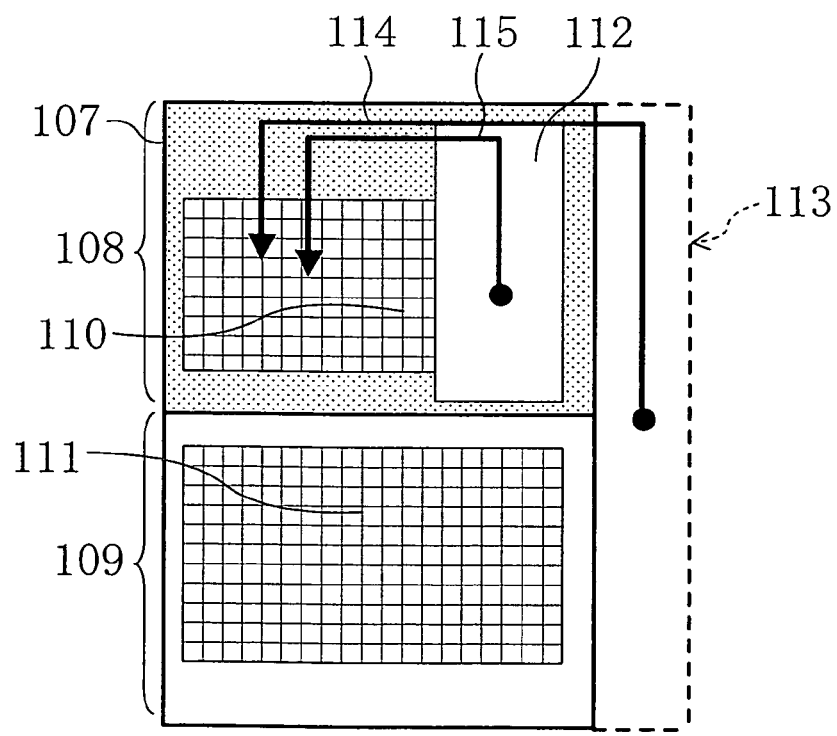
FIG. 1B is a structural diagram illustrating a standard cell in which a power source capacitor is formed in a P-channel transistor region.

FIG. 1A and 1B each illustrate an exemplary standard cell of the present invention. In FIG. 1A, 102 indicates a P-channel transistor region, 103 indicates an N-channel transistor region, 104 indicates a P-channel functional transistor forming region in which a P-channel functional transistor is formed, 105 indicates an N-channel functional transistor forming region in which an N-channel functional transistor is formed, and 106 indicates a power source capacitor forming region in which a power source capacitor is formed. A power source capacitor element is formed in the entire or a portion of the power source capacitor forming region 106. 101 indicates a standard cell including the P-channel transistor region 102 including the P-channel functional transistor forming region 104, and the N-channel transistor region 103 including the N-channel functional transistor forming region 105 and the power source capacitor forming region 106.

In FIG. 1B, 108 indicates a P-channel transistor region, 109 indicates an N-channel transistor region, 110 indicates a P-channel functional transistor forming region in which a P-channel functional transistor is formed, 111 indicates an N-channel functional transistor forming region in which an N-channel functional transistor is formed, 112 indicates a power source capacitor forming region in which a power source capacitor is formed, and a power source capacitor element is formed in the entire or a portion of the power source capacitor forming region 112. 107 indicates a standard cell including the P-channel transistor region 108 including the P-channel functional transistor forming region 110 and -the power source capacitor forming region 112, and the N-channel transistor region 109 including the N-channel functional transistor forming region 111.

The thus-constructed standard cell will be hereinafter described. In FIG. 1A, the standard cell 101 has the P-channel functional transistor forming region 104 in the P-channel transistor region 102 and the N-channel functional transistor forming region 105 in the N-channel transistor region 103 to form P-channel and N-channel functional transistors, respectively. In this example, in the standard cell 101, the size in the horizontal direction of the P-channel functional transistor forming region 104 is larger than that of the N-channel functional transistor forming region 105, and therefore, the size in the horizontal direction of the standard cell 101 is determined, depending on the size in the horizontal direction of the P-channel functional transistor forming region 104. Further, in the standard cell 101, the power source capacitor forming region 106 is provided within the horizontal direction size range of the P-channel functional transistor forming region 104, i.e., a power source capacitor is provided in a space region which is in the N-channel transistor region 103 opposing the P-channel functional transistor forming region 104, but not in the N-channel functional transistor forming region 105. Therefore, the size of the standard cell 101 does not increase when the power source capacitor is provided.

Similarly, the standard cell 107 has the P-channel functional transistor forming region 110 in the P-channel transistor region 108 and the N-channel functional transistor forming region 111 in the N-channel transistor region 109 to form P-channel and N-channel functional transistors, respectively. In this example, in the standard cell 107, the size in the horizontal direction of the N-channel functional transistor forming region 111 is larger than that of the P-channel functional transistor forming region 110, and therefore, the size in the horizontal direction of the standard cell 107 is determined, depending on the size in the horizontal direction of the N-channel functional transistor forming region 111. Further, in the standard cell 107, the power source capacitor forming region 112 is provided within the horizontal direction size range of the N-channel functional transistor forming region 111, i.e., a power source capacitor is provided in a space region which is in the P-channel transistor region 108 opposing the N-channel functional transistor forming region 111, but not in the P-channel functional transistor forming region 110. Therefore, the size of the standard cell 107 does not increase when the power source capacitor is provided.

An effect of the present invention caused by the above-described structure will be hereinafter described. As in the first example, when the power source capacitor forming region 106 or the power source capacitor forming region 112 is provided within the horizontal direction size of the standard cell 101 or 107, and a power source capacitor is provided in the entire or a portion of the power source capacitor forming region 106 or the power source capacitor forming region 112, the size of the standard cell 101 does not increase.

Further, by using the standard cell proposed in the first example in a semiconductor integrated circuit, the area of the semiconductor integrated circuit does not increase when a power source capacitor is provided.

Conventional standard cells have a structure equivalent to that of when a power source capacitor is provided outside the standard cell. In other words, referring to FIGS. 1A and 1B for the sake of convenience, in FIG. 1A, a power source capacitor is provided in a power source capacitor forming region 113 which is located adjacent to the P-channel transistor region 102 and the N-channel transistor region 103 opposing each other and ranges over a height which is the same as that of the standard cell composed of the transistor regions opposing each other; and in FIG. 1B, a power source capacitor is provided in a power source capacitor forming region 113 which is located adjacent to the P-channel transistor region 108 and the N-channel transistor region 109 opposing each other and ranges over a height which is the same as that of the standard cell composed of the transistor regions opposing each other. In FIG. 1A, a current flowing from the power source capacitor provided in the conventional power source capacitor forming region 113 to the functional transistor in the P-channel functional transistor forming region 104 is reduced due to a power source wiring line resistance 114. However, in the first example, a power source capacitor is formed in the power source capacitor forming region 106, which is closer to the functional transistor in the P-channel functional transistor forming region 104 than to the conventional power source capacitor forming region 113, thereby obtaining a power source wiring line resistance 115 which is smaller than the power source wiring line resistance 114. Therefore, the power source wiring line resistance can be reduced as compared to the power source wiring line resistance 114 between the functional transistor of the P-channel functional transistor forming region 104 and the power source capacitor of the power source capacitor forming region 113, thereby making it possible to effectively suppress the peak IR-Drop. Similarly, in FIG. 1B, a current flowing from the power source capacitor provided in the conventional power source capacitor forming region 113 to the functional transistor of the P-channel functional transistor forming region 110 is reduced due to a power source wiring line resistance 114. However, in the present invention, a power source capacitor is formed in the region 112 farther inside the standard cell than the conventional power source capacitor forming region 113, thereby obtaining a power source wiring line resistance 115 smaller than the power source wiring line resistance 114. Therefore, the power source wiring line resistance can be reduced as compared to the power source wiring line resistance 114 between the functional transistor of the P-channel functional transistor forming region 110 and the power source capacitor of the power source capacitor forming region 113, thereby making it possible to effectively suppress the peak IR-Drop.

When an end portion of the functional transistor in the N-channel functional transistor forming region 105 or the P-channel functional transistor forming region 110 is a source region which is connected to a power source wiring line of a MOS transistor forming a power source capacitor, the source or drain region of the power source capacitor and the source region connected to a power source and located at the end portion of the functional transistor can be provided as a common region. With such a structure, the source region of the power source capacitor in the standard cell can be reduced, resulting in an enlarged power source capacitor forming region. Therefore, as compared to when the source region of the functional transistor is not used in common, the power source capacitor can be increased by a size of the common region which serves as both the source region of the power source capacitor and the source region of the functional transistor.

SECOND EXAMPLE

Next, a standard cell according to a second example of the present invention will be described with reference to FIG. 2.

In the second example, the present invention is applied to a standard cell having three or more transistor regions including two P-channel transistor regions and one N-channel transistor region.

Figure 2:
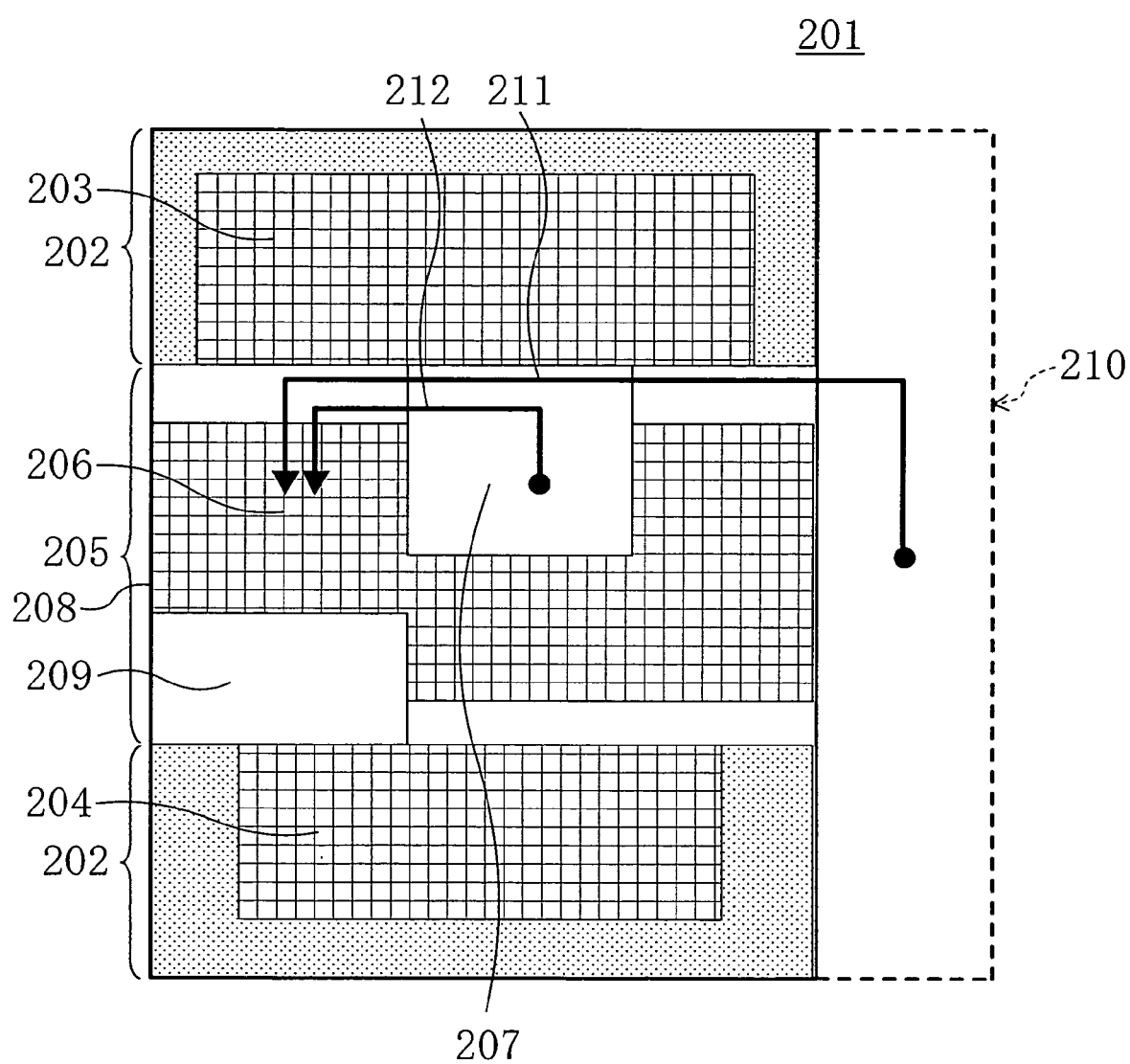
FIG. 2 is a structural diagram illustrating a standard cell according to a second example of the present invention.

In FIG. 2, 201 indicates a standard cell, 202 indicates a P-channel transistor region, 203 and 204 each indicate a P-channel functional transistor forming region in which a P-channel functional transistor is formed, 205 indicates an N-channel transistor region, 206 indicates an N-channel functional transistor forming region in which an N-channel functional transistor is formed, 207 and 209 each indicate a power source capacitor forming region in which a power source capacitor is formed, 208 indicates a left-hand end portion of the standard cell 201. In the standard cell 201, two P-channel transistor regions 202 and one the N-channel transistor region 205, i.e., a total of three regions, are formed. Further, in the standard cell 201, the rectangular power source capacitor forming region 207 surrounded by the P-channel functional transistor forming region 203 in the P-channel transistor region 202 and the N-channel functional transistor forming region 206 in the N-channel transistor region 205, and the rectangular power source capacitor forming region 209 surrounded by the P-channel functional transistor forming region 204 of the P-channel transistor region 202, the N-channel functional transistor forming region 206 of the N-channel transistor region 205, and the left-hand end portion 208 of the standard cell 201, are formed, and a power source capacitor is formed in the entire or a portion of *the power source capacitor forming region 207 and the power source capacitor forming region 209.

The thus-constructed standard cell 201 will be described in greater detail. The size in the horizontal direction of the standard cell 201 is determined, depending on the N-channel functional transistor forming region 206 which is the largest in the horizontal direction of all functional transistors. In this case, for example, as shown in FIG. 2, the P-channel functional transistor forming region 203 is in the shape of a rectangle, the N-channel functional transistor forming region 206 is in the shape of a concave, and a power source capacitor is provided in the power source capacitor forming region 207 which is surrounded by and in contact with all or a portion of three sides of the N-channel functional transistor forming region 206 (inside the concave portion) and a bottom side of the P-channel functional transistor forming region 203 (a total of four sides). As a result, a standard cell whose size in the horizontal direction does not vary is constructed.

Similarly, when a power source capacitor is provided in the power source capacitor forming region 209 which is surrounded by and in contact with all or a portion of a top side of the P-channel functional transistor forming region 204, two sides of the N-channel functional transistor forming region 206, and the left-hand end portion 208 of the standard cell, a standard cell whose size in the horizontal direction does not vary is constructed.

An effect of the present invention caused by possessing the above-described structure will be hereinafter illustrated. As illustrated in the second example, by providing the power source capacitor forming region 207 and the power source capacitor forming region 209 within the range of the size in the horizontal direction of the standard cell 201 and providing a power source capacitor in the entire or a portion of the power source capacitor forming region 207 and the power source capacitor forming region 209, the size of the standard cell 201 does not increase.

By using the standard cell 201 of the second example in a semiconductor integrated circuit, the area of the semiconductor integrated circuit does not increase when a power source capacitor is added.

Conventional standard cells have a structure equivalent to that of when a power source capacitor is provided outside the standard cell. Therefore, referring to FIG. 2, a conventional power source capacitor forming region 210 is provided on a right-hand side of the standard cell 201 in FIG. 2. In this case, a current flowing from the power source capacitor of the conventional power source capacitor forming region 210 to a functional transistor provided on a left-hand side of the N-channel functional transistor forming region 206 is decreased by a power source wiring line resistance 211 illustrated in FIG. 2. However, in the second example, the power source capacitor forming region 207 is formed in the concave portion of the N-channel functional transistor forming region 206, so that a power source capacitor-to-functional transistor distance is smaller than that of the conventional power source capacitor forming region 210 is formed. In the example of FIG. 2, a power source wiring line resistance 212 which is smaller than the power source wiring line resistance 211 is obtained. Therefore, the power source wiring line resistance can be reduced as compared to the power source wiring line resistance 211 between the functional transistor and the power source capacitor, thereby making it possible to effectively suppress the peak IR-Drop.

Although, in the second example, a power source capacitor element is formed in the power source capacitor forming region 207, a similar effect can be obtained when a power source capacitor element is formed in the power source capacitor forming region 209.

In the second example, the P-channel transistor region 202, the N-channel transistor region 205, and the P-channel transistor region 202 are arranged in this order from the top in the standard cell 201. Alternatively, the present invention can be applied to a standard cell in which an N-channel transistor region, a P-channel transistor region, and an N-channel transistor region may be arranged in this order from the top.

THIRD EXAMPLE

Next, a standard cell according to a third example of the present invention will be described with reference to FIG. 3.

Figure 3:
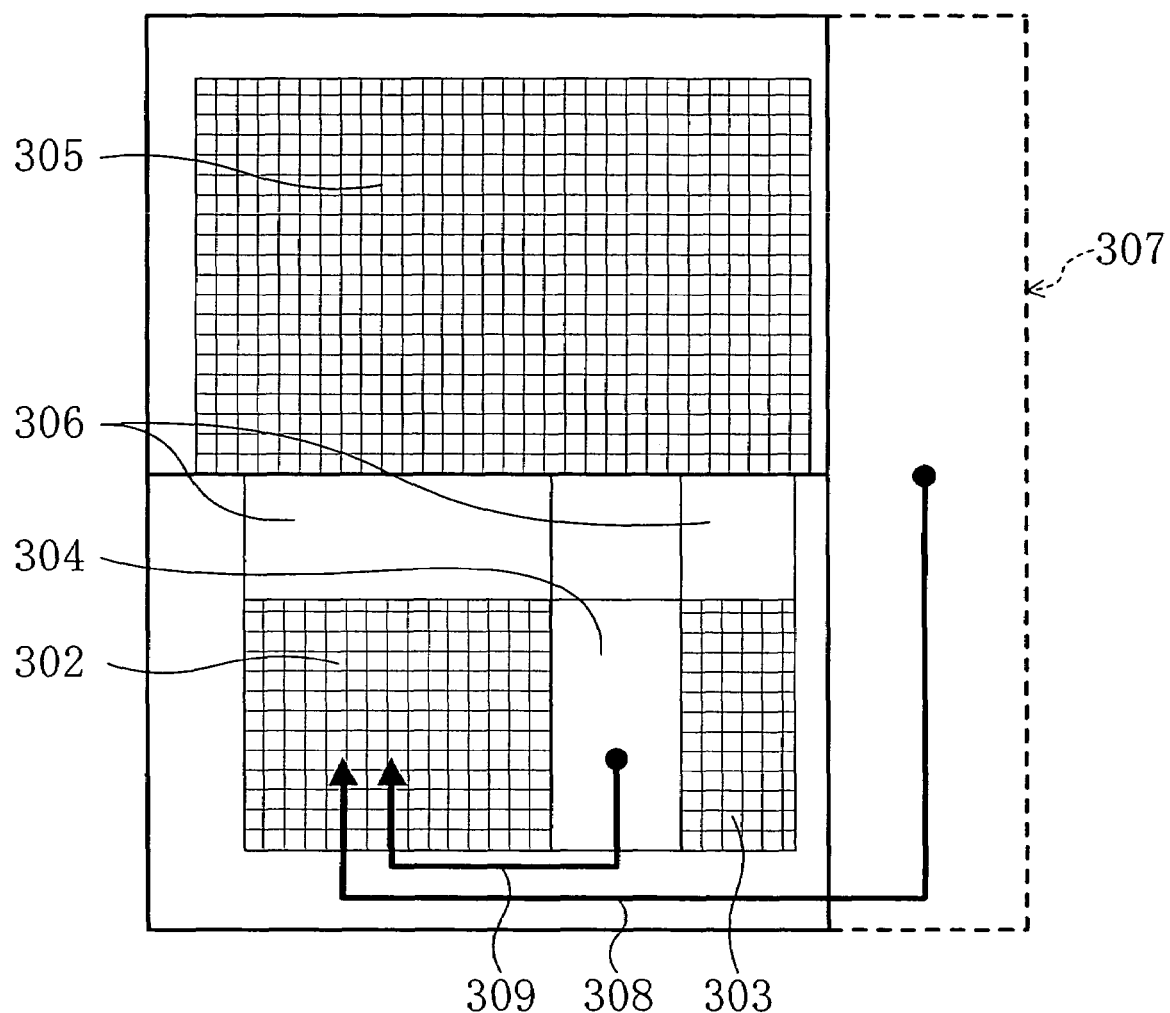
FIG. 3 is a structural diagram illustrating a standard cell according to a third example of the present invention.

In FIG. 3, 301 indicates a standard cell, and 302, 303, and 305 each indicate a functional transistor forming region in which a functional transistor is formed. Among them, the functional transistor forming regions 302 and 303 are of the same type and are included in the same transistor region, i.e., are different from the functional transistor forming region 305. 304 and 306 each indicate a power source capacitor forming region in which a power source capacitor is formed. The power source capacitor forming region 304 is formed between the functional transistor forming region 302 and the functional transistor forming region 303. The power source capacitor forming region 306 is formed between the functional transistor forming region 302 and the functional transistor forming region 305 and between the functional transistor forming region 303 and the functional transistor forming region 305. A power source capacitor is formed in the entire or a portion of the power source capacitor forming region 304 and the power source capacitor forming region 306. 307 indicates a region in which a conventional power source capacitor is formed. 308 indicates a power source wiring line resistance. 309 indicates a power source wiring line resistance.

The thus-constructed standard cell will be hereinafter described. The standard cell 301 includes the functional transistor forming regions 302, 303, and 305 in each of which a functional transistor is formed. The size in the horizontal direction of the standard cell 301 is determined, depending on the functional transistor forming region 305 which is the largest in the horizontal direction. Therefore, although a power source capacitor is provided in the power source capacitor forming region 304 between the functional transistor forming region 302 and the functional transistor forming region 303, since the functional transistor forming region 302 and the functional transistor forming region 303 are provided within the range of the size of the functional transistor forming region 305, there is not an increase in the size in the horizontal direction of the standard cell 301 when a power source capacitor is formed in the power source capacitor forming region 304.

An effect of the present invention caused by possessing the above-described structure will be hereinafter described. As illustrated in the third example, when the power source capacitor forming region 304 and the power source capacitor forming region 306 are provided within the range of the size in the horizontal direction of the standard cell, the size of the standard cell 301 is not increased when a power source capacitor is provided in the entire or a portion of the power source capacitor forming region 304 and the power source capacitor forming region 306.

By using the standard cell of the present invention in a semiconductor integrated circuit, the area of the semiconductor integrated circuit does not increase when a power source capacitor is added.

Conventional standard cells have a structure equivalent to that of when a power source capacitor is provided outside the standard cell. Therefore, a power source capacitor is formed in a conventional power source capacitor forming region 307. In this case, a current flowing from the power source capacitor provided in the conventional power source capacitor forming region 307 to a functional transistor provided in the region 302 is decreased by the power source wiring line resistance 308. However, in the third example, a power source capacitor is formed closer to the functional transistor of the region 302 than to the conventional power source capacitor forming region 307, and therefore, the power source capacitor is provided in a region in the vicinity of the functional transistor having the power source wiring line resistance 309 which is smaller than the power source wiring line resistance 308. Therefore, the power source wiring line resistance can be reduced as compared to the power source wiring line resistance 308 between the functional transistor and the power source capacitor, thereby making it possible to effectively suppress the peak IR-Drop.

Conventional standard cells have a structure equivalent to that of when a power source capacitor is provided outside the standard cell. Therefore, when a power source capacitor forming region is provided between the functional transistor forming region 302 and the functional transistor forming region 303, since the functional transistor forming region 305 opposing the power source capacitor forming region 304 is present, a power source capacitor cannot be provided. By contrast, in the third example, a power source capacitor can be provided in the power source capacitor forming region 304 in which a power source capacitor cannot be conventionally provided.

Alternatively, when a power source capacitor is provided in the power source capacitor forming region 306 located between the upper side of the functional transistor forming region 302 and the bottom side of the functional transistor forming region 305 and the power source capacitor forming region 306 located between the upper side of the functional transistor forming region 303 and the bottom side of the functional transistor forming region 305, the third example can be applied without changing the size of the standard cell 301.

FOURTH EXAMPLE

Next, a standard cell according to a fourth example of the present invention will be described with reference to FIG. 4.

Figure 4:
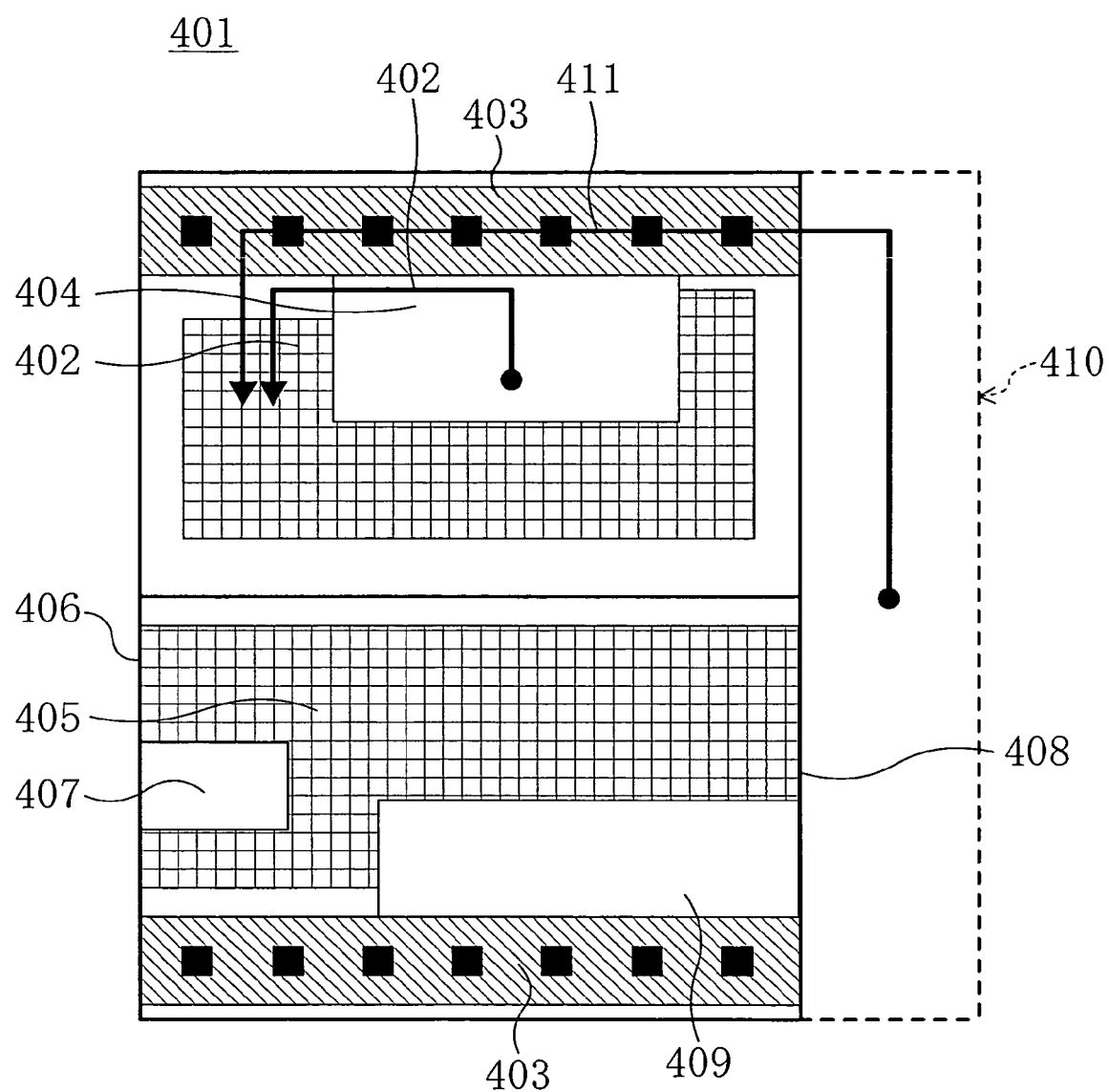
FIG. 4 is a structural diagram illustrating a standard cell according to a fourth example of the present invention.

In FIG. 4, 401 indicates a standard cell, 402 and 405 indicate functional transistor forming regions in which functional transistor of types different from each other are formed, 403 indicates a substrate contact forming region in which a substrate contact is formed, 404, 407, and 409 each indicate a power source capacitor forming region in which a power source capacitor is formed, 406 indicates a left-hand end portion of the standard cell 401, and 408 indicates a right-hand end portion of the standard cell 401. The substrate contact in the substrate contact forming region 403 is provided so as to stabilize a substrate potential of the transistor in the standard cell 401. The substrate contact has a contact which is used to connect the substrate potential of the transistor to any one of a power source potential or a ground potential, a diffusion region, and a power source wiring line. Further, the power source capacitor forming region 404 surrounded by the functional transistor forming region 402 and the substrate contact forming region 403, the power source capacitor forming region 407 surrounded by the functional transistor forming region 405 and the left-hand end portion 406 of the standard cell 401, the power source capacitor forming region 409 surrounded by the functional transistor forming region 405, the substrate contact forming region 403, and the right-hand end portion 408 of the standard cell 401, are formed. Further, a power source capacitor is formed in the entire or a portion of the power source capacitor forming region 404, the power source capacitor forming region 407, and the power source capacitor forming region 409. Further, 410 indicates a conventional power source capacitor forming region, 411 indicates a power source wiring line resistance, and 412 indicates a power source wiring line resistance.

The thus-constructed standard cell will be hereinafter described. The size in the horizontal direction of the standard cell 401 is determined, depending on the functional transistor forming region 405. Therefore, the functional transistor forming region 402 having a non-rectangular shape has a concave structure with respect to the substrate contact forming region 403. The power source capacitor forming region 404, the entire or a portion of which is surrounded by or in contact with a bottom side of the substrate contact forming region 403, and three indenting sides (right-hand side, left-hand side, and bottom side) of the concave portion of the functional transistor forming region 402 (a total of four sides), is in the range of the size in the horizontal direction of the functional transistor forming region 405. When a power source capacitor in the power source capacitor forming region 404 is provided, the size in the horizontal direction of the standard cell 401 does not vary. Similarly, the size in the horizontal direction the standard cell 401 is determined, depending on the functional transistor forming region 405. The functional transistor forming region 405 has a concave structure with respect to the left-hand end portion 406 of the standard cell 401, and the power source capacitor forming region 407 is surrounded by or in contact with all or a portion of three sides (concave portion) of the functional transistor forming region 405 and the left-hand end portion 406 of the standard cell 401 (a total of four sides). The power source capacitor forming region 407 is in the range of the size in the horizontal direction of the functional transistor forming region 405. Therefore, when a power source capacitor in the power source capacitor forming region 407 is provided, the horizontal direction of the standard cell 401 does not vary. Further, since the size in the horizontal direction the standard cell 401 is determined, depending on the functional transistor forming region 405, the power source capacitor forming region 409 which is surrounded by and in contact with all or a portion of a top side of the substrate contact forming region 403, the right-hand end portion 408 (one side) of the standard cell 401, and two sides (lower right portion) of the functional transistor forming region 405 (a total of four sides), is in the range of the size in the horizontal direction of the functional transistor forming region 405. Therefore,when a power source capacitor in the power source capacitor forming region 409 is provided, the size of the horizontal direction of the standard cell 401 does not vary.

An effect of the fourth example provided with the above-described structure will be described. As in the fourth example, the power source capacitor forming region 404, the power source capacitor forming region 407, and the power source capacitor forming region 409 are provided within the range of the size in the horizontal direction of the standard cell, and a power source capacitor is provided in the entire or a portion of the power source capacitor forming region 404, the power source capacitor forming region 407, and the power source capacitor forming region 409, thereby making it possible to achieve a standard cell whose size does not increase.

By using the standard cell proposed in the fourth example in a semiconductor integrated circuit, the area of the semiconductor integrated circuit does not increase when a power source capacitor is added.

The present invention can also be applied to the case where a functional transistor has a non-rectangular shape, as in the fourth example.

A power source wiring line through which a power source potential or a ground potential is supplied to a functional transistor is provided in a layer on the substrate contact forming region 403. Therefore, when a power source capacitor is provided in the power source capacitor forming region 404 and the power source capacitor forming region 409 in the vicinity of the substrate contact forming region 403, a distance of a power source wiring line connecting the power source wiring line present in the layer on the substrate contact forming region 403 and the power source capacitor is shorter than when the power source capacitor is not provided in the vicinity of the substrate contact forming region 403. Therefore, as compared to when the power source capacitor is not provided in the vicinity of the substrate contact, a power source wiring line resistance from the power source capacitor to the functional transistor is reduced, thereby increasing the effect of reducing the IR-Drop of the standard cell.

Conventional standard cells have a structure equivalent to that of when a power source capacitor is provided outside the standard cell. In FIG. 4, a power source capacitor is formed in a conventional power source capacitor forming region 410. In this case, a current flowing from the power source capacitor of the conventional power source capacitor forming region 410 to a functional transistor provided on a left-hand side of the functional transistor forming region 402 is decreased by the power source wiring line resistance 411. However, in the fourth example, a power source capacitor is formed closer to the functional transistor of the functional transistor forming region 402 than to the conventional power source capacitor forming region 410, and therefore, the power source capacitor is provided in a region in the vicinity of the functional transistor having the power source wiring line resistance 412, which is smaller than the power source wiring line resistance 411. Therefore, the power source wiring line resistance can be reduced as compared to the power source wiring line resistance 411 between the functional transistor and the power source capacitor, thereby making it possible to effectively suppress the peak IR-Drop.

FIFTH EXAMPLE

Next, a standard cell according to a fifth example of the present invention will be described with reference to FIGS. 5A to 5D.

Figure 5A:
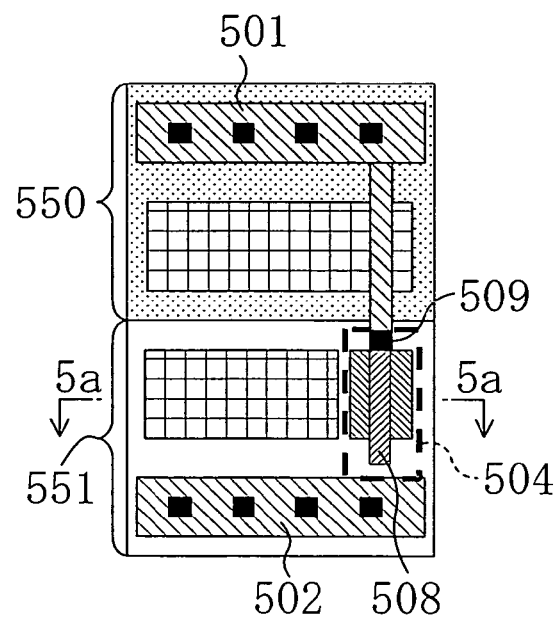
FIG. 5A is a structural diagram illustrating a standard cell according to a fifth example of the present invention in which a power source capacitor is formed in an N-channel transistor region.
Figure 5B:
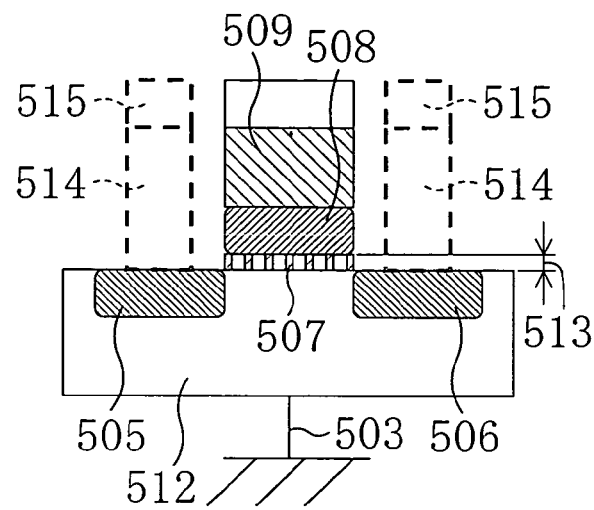
FIG. 5B is a cross-sectional view of the power source capacitor of FIG. 5A.
Figure 5C:
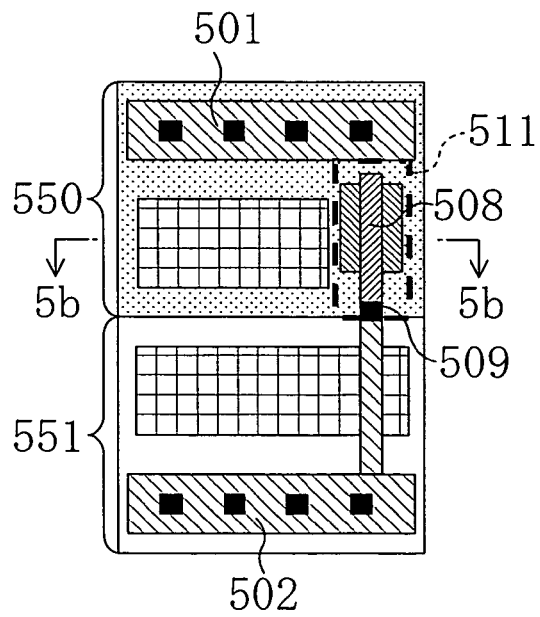
FIG. 5C is a structural diagram illustrating a standard cell in which a power source capacitor is formed in a P-channel transistor region.
Figure 5D:
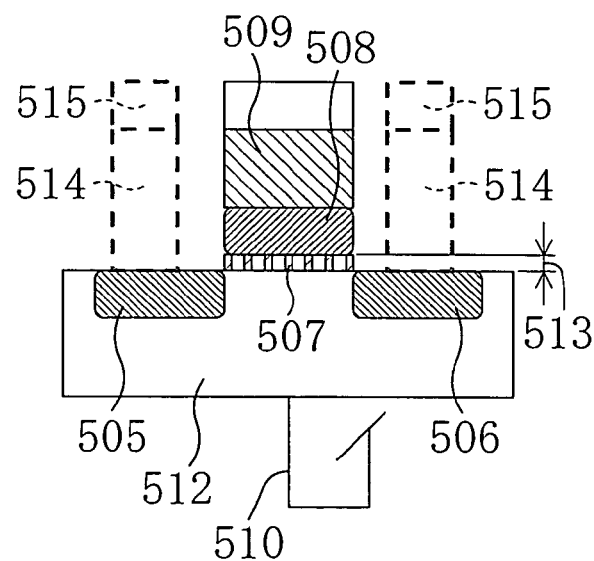
FIG. 5D is a cross-sectional view of the power source capacitor of FIG. 5C.

In FIGS. 5A and 5B, 550 indicates a P-channel transistor region in which a P-channel transistor can be formed, 551 indicates an N-channel transistor region in which an N-channel transistor can be formed, 501 indicates a power source wiring line through which a power source potential is supplied, 502 indicates a power source wiring line through which a ground potential is supplied, 503 indicates a substrate potential of the N-channel transistor, and 504 indicates a power source capacitor which is composed of an N-channel transistor. FIG. 5B is a cross-sectional view, taken along line 5a-5a of the power source capacitor 504 of FIG. 5A. 505 and 506 each indicate a source region or a drain region of a MOS transistor, 507 indicates a gate oxide film, 508 indicates a gate electrode of the power source capacitor 504, 509 indicates a contact, 512 indicates a substrate, and 513 indicates a capacitor. Similarly, in FIG. 5C, 550 indicates a P-channel transistor region in which a P-channel transistor can be formed, 551 indicates an N-channel transistor region in which an N-channel transistor can be formed, 511 indicates a power source capacitor composed of a P-channel transistor. FIG. 5D is a cross-sectional view, taken along line 5b-5b of the power source capacitor 511 of FIG. 5C. 510 indicates a substrate potential of the P-channel transistor.

The power source capacitor 504 and the power source capacitor 511 in the thus-constructed standard cell will be described. In FIG. 5A, the gate electrode 508 of the power source capacitor 504 connected via the contact 509 to the power source wiring line 501 through which a power source potential is supplied has a potential reverse to that of the substrate potential 503 of the N-channel transistor, since the gate electrode 508 of the power source capacitor 504 has the power source potential and the substrate potential 503 has the ground potential. Further, the gate oxide film 507, which is an insulator, is present between the gate electrode 508 and the substrate 512, and therefore, the capacitor 513 is formed between the; gate electrode 508 of the power source capacitor 504 and the substrate 512. Similarly, in FIG. 5C, the gate electrode 508 of the power source capacitor 511 connected via the contact 509 to the power source wiring line 502 through which the ground potential is supplied has a potential reverse to that of the substrate potential 510 of the P-channel transistor. Further, since the gate oxide film 507, which is an insulator, is present between the gate electrode 508 and the substrate 512, the capacitor 513 is formed between the gate electrode 508 of the power source capacitor 511 and the substrate 512. The above-described capacitor 513 is a power source capacitor constructed in the standard cell of the present invention. Since the power source capacitor can be formed only by connecting a power source wiring line to a gate electrode of a MOS transistor, a power source wiring line 514 connected to the source region or the drain region (505 and 506) of the power source capacitor and a contact 515 connected to the source region and the drain region can be reduced.

An effect of the present invention caused by possessing the above-described structure will be described. In the standard cell, when a signal wiring line determines the area of the standard cell, the power source wiring line 514 connected to the source region or the drain region (505 and 506) of the power source capacitor in the standard cell and the region of the contact 515 connecting the power source wiring line 514 and the source region and the drain region are no longer required, and can be allocated to the signal wiring line region of the standard cell, thereby saving the area of the standard cell.

SIXTH EXAMPLE

Next, a standard cell according to a sixth example of the present invention will be described with reference to FIGS. 6A to 6D.

Figure 6A:
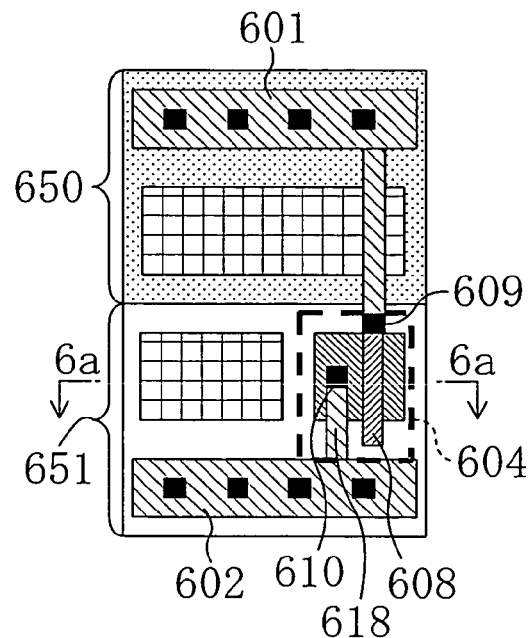
FIG. 6A is a structural diagram illustrating a standard cell according to a sixth example of the present invention in which a power source capacitor is formed in an N-channel transistor region.
Figure 6B:
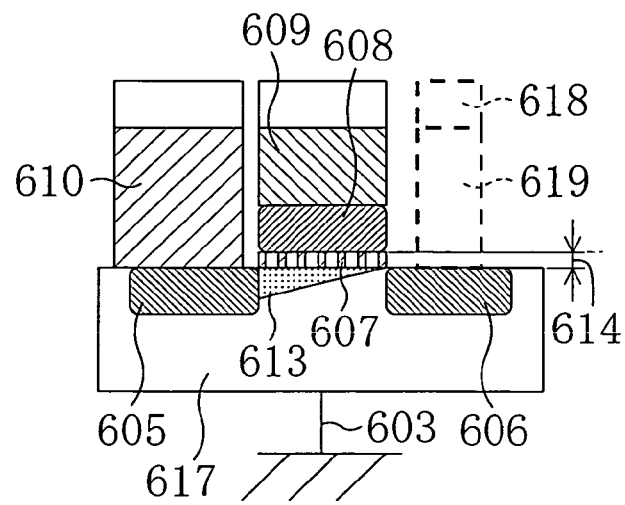
FIG. 6B is a cross-sectional view of the power source capacitor of FIG. 6A.
Figure 6C:
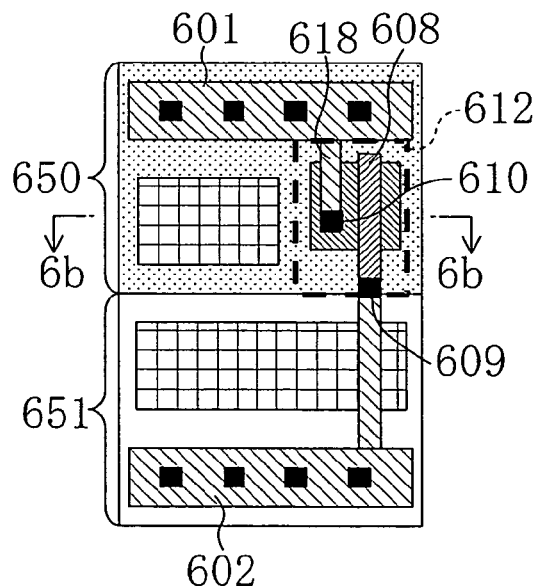
FIG. 6C is a structural diagram illustrating a standard cell in which a power source capacitor is formed in a P-channel transistor region.
Figure 6D:
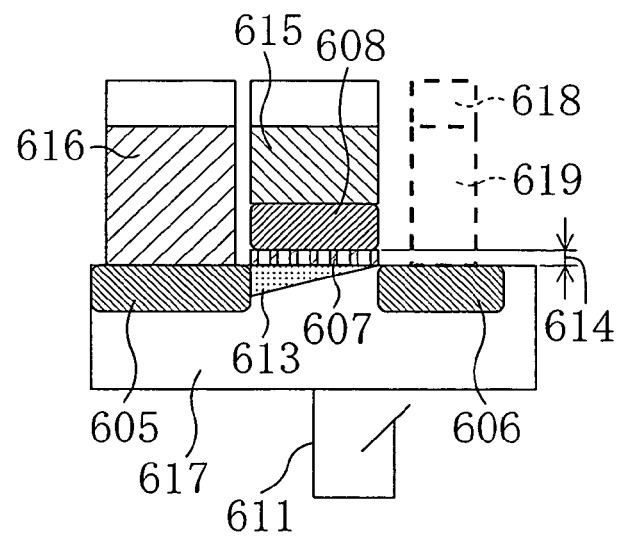
FIG. 6D is a cross-sectional view of the power source capacitor of FIG. 6C.

FIGS. 6A and 6C each illustrate a standard cell of the sixth example. In FIG. 6A, 650 indicates a P-channel transistor region in which a P-channel transistor can be formed, 651 indicates an N-channel transistor region in which an N-channel transistor can be formed, 601 indicates a power source wiring line through which a power source potential is supplied, 602 indicates a power source wiring line through which a ground potential is supplied, 603 indicates a substrate potential of an N-channel transistor, 604 indicates a power source capacitor composed of an N-channel transistor. FIG. 6B is a cross-sectional view, taken along line 6a-6a of the power source capacitor 604 composed of an N-channel transistor in FIG. 6A. 605 and 606 each indicate a source region or a drain region of the power source capacitor, 607 indicates a gate oxide film, 608 indicates a gate electrode of the power source capacitor, 609 indicates a contact connecting the gate electrode and the power source potential, 610 indicates a contact contacting the source or drain region of the power source capacitor and the ground potential, 613 indicates a channel region, 614 indicates a capacitor, and 617 indicates a substrate. In FIG. 6C, 650 indicates a P-channel transistor region in which a P-channel transistor can be formed, 651 indicates an N-channel transistor region in which an N-channel transistor can be formed, 611 a substrate potential of a P-channel transistor, and 612 indicates a power source capacitor composed of a P-channel transistor. FIG. 6D is a cross-sectional view, taken along line 6b-6b of the power source capacitor 612 composed of a P-channel transistor in FIG. 6C. In FIG. 6D, 615 indicates a contact connecting a gate potential and a ground potential, 616 indicates a contact connecting a source or drain region of the power source capacitor and a power source potential.

The thus-constructed power source capacitor composed of an N-channel transistor in the standard cell of FIGS. 6A and 6B will be hereinafter described. The gate electrode 608 of the power source capacitor 604 connected via the contact 609 to the power source wiring line 601 through which the power source potential is supplied has a potential reverse to that of the substrate potential 603 of the N-channel transistor. Further, since the gate oxide film 607, which is an insulator, is present between the gate electrode 608 of the power source capacitor 604 and the substrate 617, the capacitor 614 is formed between the gate electrode 608 of the power source capacitor and the substrate 617. Further, since the source region or drain region 605 of the power source capacitor 604 is connected via the contact 610 to the power source wiring line 602 through which the ground potential is supplied, the channel region 613 is formed in the substrate 617. Therefore, the capacitor 614 is formed between the gate electrode 608 of the power source capacitor 604 and the substrate 617.

Similarly, the power source capacitor composed of a P-channel transistor in the standard cell of FIGS. 6C and 6D will be hereinafter described. The gate electrode 608 of the power source capacitor 612 connected via the contact 615 to the power source wiring line 602 through which the ground potential is supplied has a potential reverse to that of the substrate potential 611 of the P-channel transistor. Further, since the gate oxide film 607, which is an insulator, is present between the gate electrode 608 of the power source capacitor 612 and the substrate 617, the capacitor 614 is formed between the gate electrode 608 of the power source capacitor and the substrate 617. Further, since the source region or drain region 605 of the power source capacitor 612 is connected via the contact 616 to the power source wiring line 601 through which the power source potential potential is supplied, the channel region 613 is formed in the substrate 617. Therefore, the capacitor 614 is formed between the gate electrode 608 of the power source capacitor 612 and the substrate 617.

As described above, according to the sixth example, in a standard cell, when a signal wiring line determines the area of the standard cell, the power source wiring line 618 connected to the source region or the drain region of the power source capacitor 604 or 612 in the standard cell and the region of the contact 619 connecting the source region and the drain region, can be allocated to the signal wiring line region of the standard cell, thereby saving the area of the standard cell.

The power source wiring line 601 through which the power source potential is supplied or the power source wiring line 602 through which the ground potential is supplied is electrically connected to the source region or drain region 605 of the power source capacitor 604 or 612. Therefore, the channel region 613 is formed in the substrate 617. Therefore, a value of a power source capacitor connected to a power source wiring line can be increased, thereby making it possible to effectively reduce the IR-Drop in the standard cell.

SEVENTH EXAMPLE

Next, a standard cell according to a seventh example of the present invention will be described with reference to FIGS. 7A and 7B.

Figure 7A:
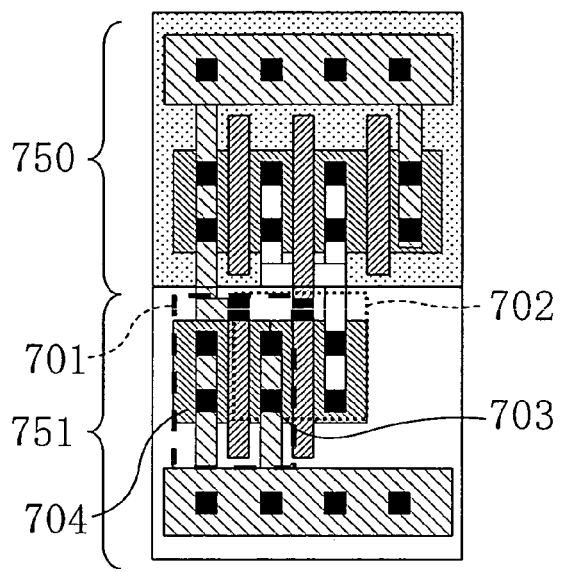
FIG. 7A is a structural diagram illustrating a standard cell according to a seventh example of the present invention, in which a power source capacitor is formed in an N-channel transistor region.
Figure 7B:
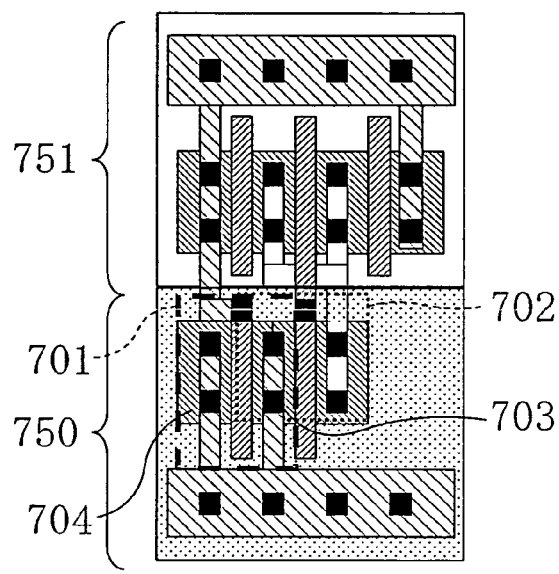
FIG. 7B is a structural diagram illustrating a standard cell in which a power source capacitor is formed in a P-channel transistor region.

In FIGS. 7A and 7B, 750 indicates a P-channel transistor region in which a P-channel transistor can be formed, and 751 indicates an N-channel transistor region in 1 5 which an N-channel transistor can be formed. 701 surrounded with a dashed line indicates a power source capacitor forming region in which a power source capacitor is formed, 702 surrounded with a dotted line indicates a functional transistor forming region in which a functional transistor is formed, 703 indicates a common portion of a source region connected to a power source wiring line of the functional transistor and a source 20 region or a drain region of the power source capacitor, and 704 indicates the source region or the drain region of the power source capacitor. FIG. 7A illustrates a power source capacitor composed of an N-channel transistor, while FIG. 7B illustrates a power source capacitor composed of a P-channel transistor.

The power source capacitors in the standard cells of FIGS. 7A and 7B will be 25 hereinafter described. In FIGS. 7A and 7B, a source region of the functional transistor in the functional transistor forming region 702, which is connected to the power source wiring line, and the source region or drain region 704 of the power source capacitor in the power source capacitor forming region 701 have the same potential, and therefore, can be connected to each other. Therefore, the source region or drain region 704 of the power source capacitor in the power source capacitor forming region 701 and the source region of the functional transistor in the functional transistor forming region 702, which is connected to the power source wiring line, are provided as a common region to construct the common portion 703.

As described above, according to the seventh example, the source region or drain region 704 of the power source capacitor in the power source capacitor forming region 701 and the source region of the functional transistor in the functional transistor forming region 702, which is connected to the power source wiring line, are provided as a common region, thereby reducing the source region or drain region 704 of the power source capacitor. In the region thus reduced, a power source capacitor which is larger than when the source region or drain region 704 of the power source capacitor in the power source capacitor forming region 701 and the source region of the functional transistor in the functional transistor forming region 702, which is connected to the power source wiring line, are not provided as a common region, can be constructed. By sharing the common portion 703, a power source wiring line resistance from the source region or drain region 704 of the power source capacitor to the functional transistor source region connected to the power source wiring line can be reduced, making it possible to more effectively reducing IR-Drop than when the source region or drain region 704 of the power source capacitor in the power source capacitor forming region 701 and the source region of the functional transistor in the functional transistor forming region 702, which is connected to the power source wiring line, are not provided as a common region.

EIGHTH EXAMPLE

Next, a standard cell according to an eighth example of the present invention will be described with reference to FIG. 8.

Figure 8:
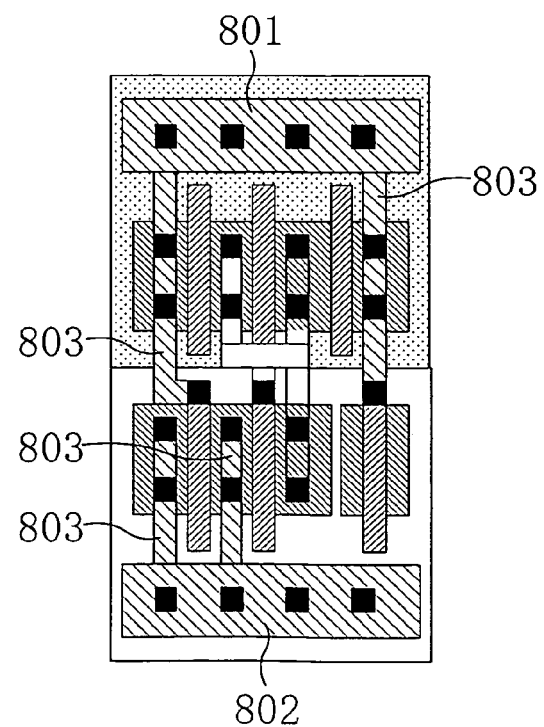
FIG. 8 is a structural diagram illustrating a standard cell according to an eighth example of the present invention.

In FIG. 8, 801 indicates a power source wiring line through which a power source potential is supplied, 802 indicates a power source wiring line through which a ground potential is supplied, and 803 indicates a power source wiring line connected to a power source capacitor.

The thus-constructed power source capacitor in the standard cell will be hereinafter described. The power source wiring line 803 connected to the power source capacitor is provided so that the power source wiring line 803 is connected perpendicular to the power source wiring line 801 through which the power source potential is supplied and the power, source wiring line 802 through which the ground potential is supplied.

As described above, according to the eighth example, the power source wiring line 803 connected to the power source capacitor is provided perpendicular to power source wiring lines in the standard cell, i.e., the power source wiring line 801 through which the power source potential is supplied, and the power source wiring line 802 through which the ground potential is supplied. Therefore, a length of the power source wiring line 803 connected to the power source capacitor can be reduced, resulting in a small power source wiring line resistance of the power source wiring line connected to the power source capacitor. Therefore, the effect of reducing IR-Drop due to the power source capacitor can be enhanced as compared to when a power source capacitor and a power source wiring line in a standard cell are bent for the purpose of layout.

NINTH EXAMPLE

Next, a ninth example of the present invention will be described with reference to FIGS. 9A and 9B.

Figure 9A:
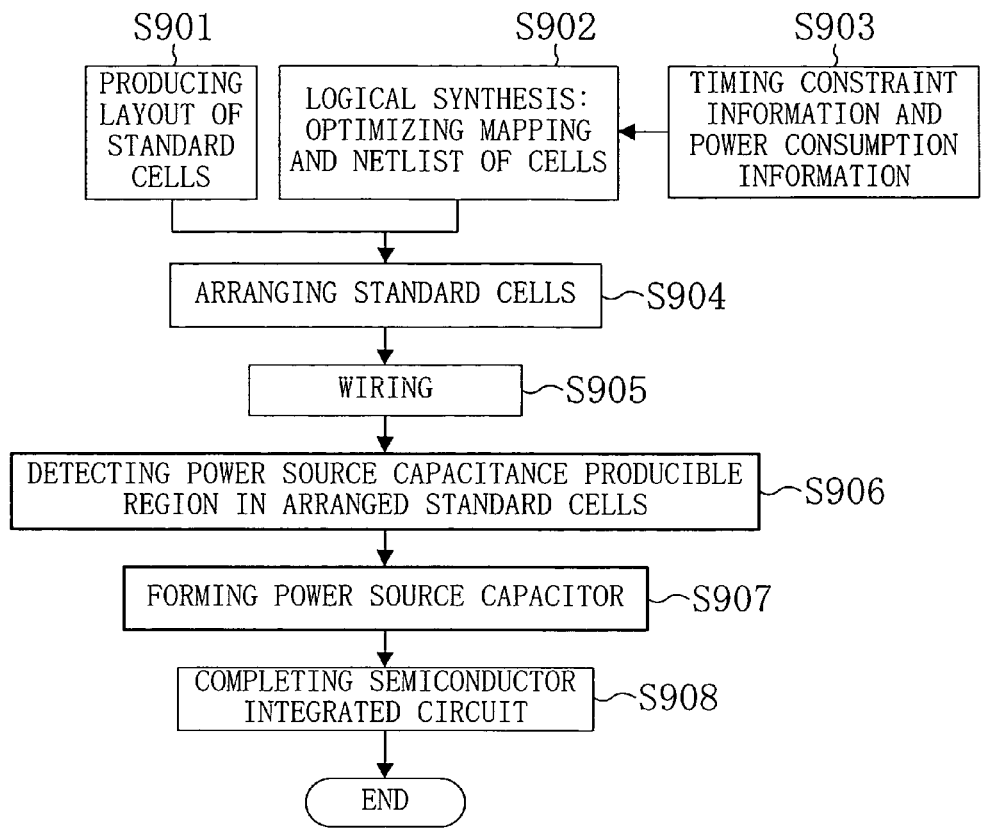
FIG. 9A is a flow chart of an automatic placing and routing method according to a ninth example of the present invention.

FIG. 9A illustrates an exemplary method of automatic placing and routing. FIG. 9B illustrates an exemplary semiconductor integrated circuit composed of a plurality of standard cells. In FIG. 9A, in order to design a semiconductor integrated circuit using automatic placing and routing, in step S901, a layout of standard cells which may be used on a netlist is previously produced. Next, apart from this step, a netlist required when designing a semiconductor integrated circuit is logically synthesized from a functionally described resistor transfer level (RTL) in step S902, using information required to optimize the netlist, such as timing information, power consumption information, and the like, which are obtained in step S903. In the logical synthesis step S902, the netlist is optimized based on indicators given in step S903, such as cell mapping, timing information, power consumption information, and the like. Also in the logical synthesis step S902, a standard cell produced in the standard cell layout producing step S901 is selected. In step S904, standard cells are arranged based on the netlist thus produced by logical synthesis in step S902. Next, in step S905, wiring is performed between each standard cell to satisfy a connection relationship between each standard cell. Next, as is different from conventional techniques in which a space region between each standard cell is detected, in step S906 (power source capacitor forming region detecting step), a power source capacitor producible region which is a space region between each functional transistor region in a semiconductor integrated circuit in which the standard cells are provided is detected, and in a power source capacitor forming step S907, a power source capacitor is constructed in the semiconductor integrated circuit. In such a power source capacitor forming step S907, a region for forming a power source capacitor is required in addition to a region in which a standard cell is provided, resulting in an increase in the area of the semiconductor integrated circuit, though standard cells are provided without a space region in a semiconductor integrated circuit in conventional techniques. By contrast, by detecting a space region between each functional transistor region, the space region between each functional transistor region is utilized to construct a power source capacitor in a semiconductor integrated circuit in which standard cells are provided without a space region, thereby making it possible to construct a semiconductor integrated circuit without an increase in the area thereof. The above-described steps are repeated until a specification (e.g., timing, power consumption, etc.) is satisfied, so that standard cells are arranged in a semiconductor integrated circuit, and thereafter, a power source capacitor is constructed without an increase in the area of the semiconductor integrated circuit.

In the above-described automatic placing and routing method, a structure of a semiconductor integrated circuit by the standard cell arranging step S904, or the wiring step S905 and the power source capacitor forming step S907 will be described.

Figure 9B:
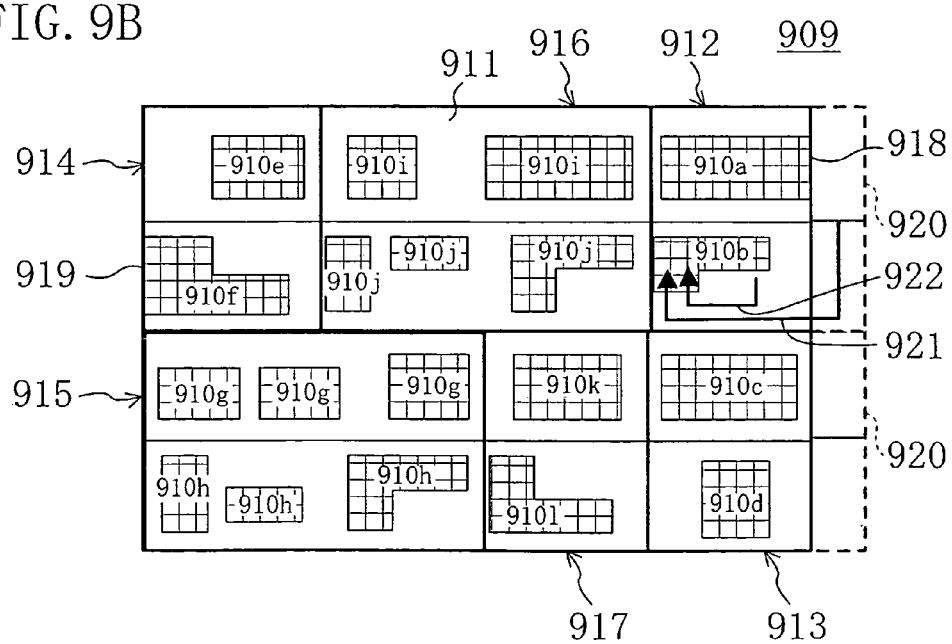
FIG. 9B is a structural diagram illustrating a semiconductor integrated circuit.

FIG. 9B illustrates an exemplary semiconductor integrated circuit in which a power source capacitor is constructed according to the ninth example. In FIG. 9B, 909 indicates a semiconductor integrated circuit, 910a to 910h each indicate a functional transistor forming region in which a functional transistor is formed, 911 indicates a power source capacitor forming region in which a power source capacitor is formed, excluding the region 910a to 910h from the semiconductor integrated circuit 909, 912 to 917 each indicate a standard cell. In the semiconductor integrated circuit 909, the standard cells 912 and 916 in which a power source capacitor is not formed and which are composed of only a functional transistor, are provided. Further, a power source capacitor is formed in the entire or a portion of the power source capacitor forming region 911, which is a region of the semiconductor integrated circuit 909 excluding the functional transistor forming regions 910a to 910h. 920 indicates a conventional power source capacitor forming region, 921 indicates a conventional power source wiring line resistance, and 922 indicates a power source wiring line resistance.

The semiconductor integrated circuit 909 in which the standard cells 912 to 917 composed of only functional transistors are formed in a step before providing a power source capacitor to the semiconductor integrated circuit, will be described. The size in the horizontal direction of the semiconductor integrated circuit 909 does not increase in a right-hand direction unless a power source capacitor is constructed in a region on a farther right-hand side than a rightmost side 918 of a functional transistor forming region in the standard cell 912 provided at a rightmost end of the semiconductor integrated circuit 909. Also, the size in the horizontal direction of the semiconductor integrated circuit 909 does not increase in a left-hand direction unless a power source capacitor is constructed in a region on a farther left-hand side than a leftmost side 919 of a functional transistor forming region in the standard cell 914 provided in the semiconductor integrated circuit 909.

Therefore, when a power source capacitor is provided in the power source capacitor forming region 911 which is a region on a farther right-hand side than the leftmost side 919 of the semiconductor integrated circuit 909 and on a farther left-hand side than the rightmost side 918, the size in the horizontal direction of the semiconductor integrated circuit 909 does not increase.

A size in a vertical direction of a semiconductor integrated circuit in which standard cells are provided is determined, depending on the number of standard cells which are arranged in the vertical direction. Therefore, the semiconductor integrated circuit 909 is determined, depending on the standard cell 912 and the standard cell 913, the standard cell 914 and the fourth standard cell 915, and the fifth standard cell 916 and the sixth standard cell 917. Therefore, the size in the vertical direction (height direction) of the semiconductor integrated circuit 909 does not increase when a power source capacitor is provided in the power source capacitor forming region 911, which is a region which is upper than a bottom end of the standard cell 913 and lower than a top end of the standard cell 912.

In the automatic placing and routing method illustrated in the ninth example, the wiring process is included after arrangement of standard cells. Alternatively, a power source capacitor may be provided using any step of constructing a power source capacitor as long as the step is performed after the standard cell arranging step S904.

An effect of the ninth example caused by possessing the above-described structure will be described. Conventional techniques have a structure equivalent to that in which a power source capacitor is formed adjacent to the standard cell 912 and the standard cell 913 when the power source capacitor is formed in the semiconductor integrated circuit 909 in which standard cells are arranged without a space region, so that it is necessary to increase the area of the semiconductor integrated circuit. By contrast, in the ninth example, in the semiconductor integrated circuit 909 in which standard cells are arranged without a space region, a power source capacitor is provided in the entire or a portion of the power source capacitor forming region 911, which is a region on a farther right-hand side than the leftmost side 919 which determines the size of the semiconductor integrated circuit 909, on a farther left-hand side than the rightmost side 918 of the functional transistor forming region, on an upper side than the bottom end of the standard cell 913, and on a lower side than the top end of the standard cell 912, so that the size of the semiconductor integrated circuit 909 does not increase.

Figure 15A:
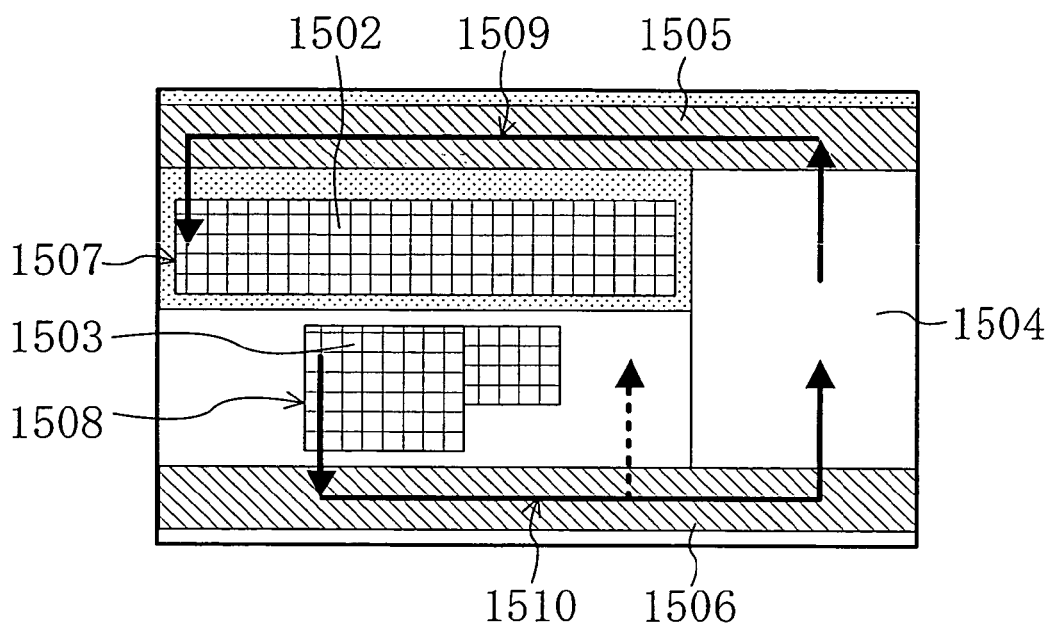
FIG. 15A is a structural diagram of a conventional standard cell.
Figure 15B:
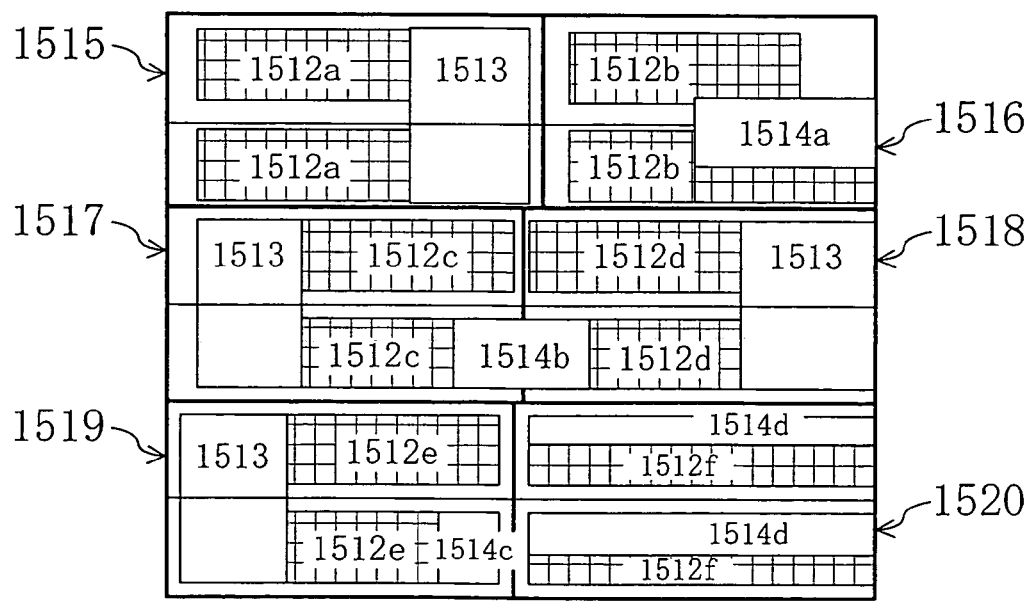
FIG. 15B is a structural diagram of a semiconductor integrated circuit in which conventional standard cells are provided.

Conventional techniques have a structure equivalent to that in which a power source capacitor is formed adjacent to the standard cells 1515 to 1520 in the semiconductor integrated circuit 1511, as illustrated with in the power source capacitor forming region 1513 in the semiconductor integrated circuit 1511 of FIG. 15B. By contrast, as illustrated in FIG. 15B, a power source capacitor can be provided in the power source capacitor unformed regions 1514a to 1514d in the standard cell. Thereby, in the standard cell of FIG. 15A, for example, when a power source capacitor is formed in a space region provided on a right-hand side of the functional transistor 1503, the power source wiring line resistance 1510 has the path indicated using a dashed line with an arrow, thereby making it possible to suppress the resistance value of a wiring line to a small value.

The resistance value of the wiring line will be further described with reference to FIG. 9B. The conventional semiconductor integrated circuit has a structure equivalent to that when a power source capacitor is provided adjacent to a standard cell provided in the semiconductor integrated circuit. Therefore, the power source capacitor is provided in the conventional power source capacitor forming region 920. A current flowing from the power source capacitor provided in the conventional power source capacitor forming region 920 to a functional transistor which is provided in the functional transistor forming region 910 of the standard cell 912, is reduced due to the power source wiring line resistance 921. However, in the present invention, a power source capacitor is provided closer to a functional transistor which is provided in the functional transistor forming region 910 of the standard cell 912 than the conventional power source capacitor region 920. Therefore, the power source capacitor is provided in a region in the vicinity of a functional transistor having the power source wiring line resistance 922 which is smaller than the power source wiring line resistance 921. Therefore, the power source wiring line resistance can be reduced as compared to that of the power source wiring line resistance 921 between the functional transistor and the power source capacitor, thereby making it possible to effectively suppress the peak IR-Drop.

TENTH EXAMPLE

Next, a semiconductor integrated circuit according to a tenth example of the present invention will be described with reference to FIG. 10.

Figure 10:
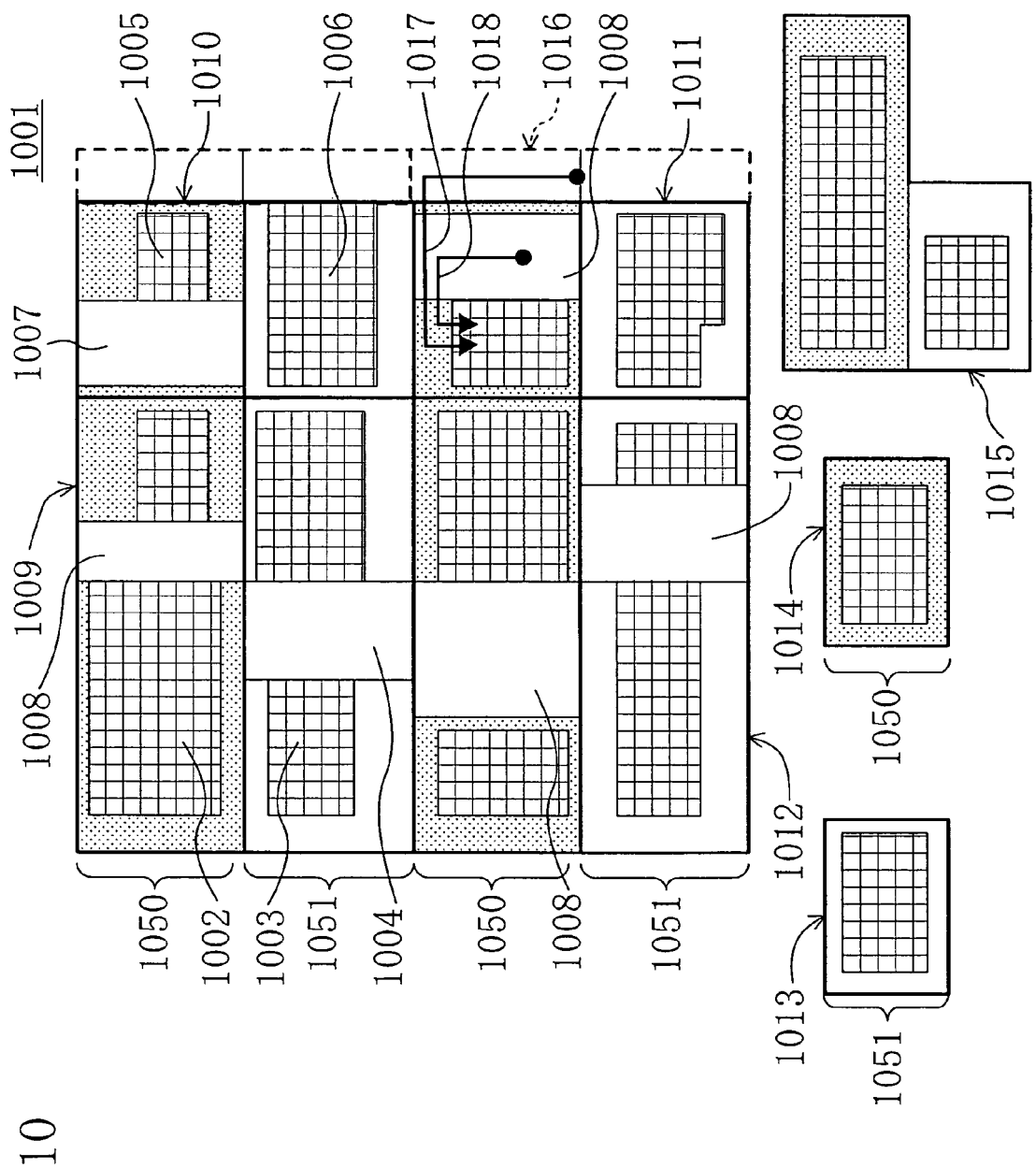
FIG. 10 is a structural diagram illustrating a semiconductor integrated circuit according to a tenth example of the present invention.

In FIG. 10, 1001 indicates a semiconductor integrated circuit, 1002 indicates a P-channel functional transistor forming region in which all functional transistors in a P-channel transistor region 1050 are formed, 1003 indicates an N-channel functional transistor forming region in which all functional transistors in an N-channel transistor region 1051 are formed, 1004 indicates a power source capacitor forming region in which a power source capacitor is formed, 1005 indicates a P-channel functional transistor forming region in the P-channel transistor region 1050 in which the P-channel functional transistor is formed, 1006 indicates an N-channel functional transistor forming region in the N-channel transistor region 1051 in which the N-channel functional transistor is formed, and 1007 and 1008 each indicate a power source capacitor forming region in which a power source capacitor element is formed. A power source capacitor is formed in the entire or a portion of the power source capacitor forming region 1004, the power source capacitor forming region 1007, and the power source capacitor forming region 1008. 1009 to 1012 each indicate a standard cell composed of the P-channel transistor region 1050 and the N-channel transistor region 1051. 1016 indicates a conventional power source capacitor forming region, 1017 indicates a power source wiring line resistance of a power source wiring line connecting from the conventional power source capacitor to the P-channel functional transistor in the standard cell 1011, 1018 indicates a power source wiring line resistance of a power source wiring line connecting the power source capacitor formed in the P-channel transistor region 1050 in the standard cell 1011 and the P-channel functional transistor in the same P-channel transistor region 1050.

The thus-constructed semiconductor integrated circuit will be hereinafter described. In FIG. 10, the size in the horizontal direction of the semiconductor integrated circuit 1001 before a power source capacitor is provided is determined, depending on the standard cell 1009 and the standard cell 1010, and the standard cell 1011 and the standard cell 1012, in which only functional transistors are provided. In the standard cell 1009 in which only a functional transistor is formed, the size in the horizontal direction of a first region 1002 in the P-channel transistor region 1050 is larger than the size in the horizontal direction of a region 1003 of the N-channel transistor region 1051 in which a functional transistor is formed. Therefore, the size in the horizontal direction of the standard cell 1009 is determined by the size in the horizontal direction of the first region 1002 in the P-channel transistor region 1050. Further, the power source capacitor forming region 1004 is provided in the standard cell 1009. However, since the power source capacitor forming region 1004 is provided within the range of the size in the horizontal direction of the P-channel functional transistor forming region 1002 in the P-channel transistor region 1050, the size in the horizontal direction of the standard cell does not increase when a power source capacitor is provided in the power source capacitor forming region 1004.

Similarly, in the standard cell 1010 in which only a functional transistor is provided, the size in the horizontal direction of the N-channel functional transistor forming region 1006 in the N-channel transistor region 1051 is larger than that of the P-channel functional transistor forming region 1005 in the P-channel transistor region 1050. Therefore, the size in the horizontal direction of the standard cell 1010 is determined by the size in the horizontal direction of the N-channel functional transistor forming region 1006. Further, the power source capacitor forming region 1007 is provided in the standard cell 1010. Since the power source capacitor forming region 1007 is provided within the range of the size in the horizontal direction of the N-channel functional transistor forming region 1006, the size in the horizontal direction of the standard cell 1010 does not increase when a power source capacitor is provided in the power source capacitor forming region 1007. Similarly, the same is true of the standard cell 1011 and the standard cell 1012. When a power source capacitor is provided in the power source capacitor forming region 1008, the size in the horizontal direction of each of the standard cell 1011 and the standard cell 1012 does not increase. In other words, the semiconductor integrated circuit is composed of the standard cells 1009 to 1012, and the size in the horizontal direction of the semiconductor integrated circuit 1001 does not increase when a power source capacitor is provided in the entire or a portion of the power source capacitor forming region 1004, the power source capacitor forming region 1007, and the power source capacitor forming region 1008.

As described above, the semiconductor integrated circuit 1001 is composed of the standard cells 1009 to 1012, so that the size in the horizontal direction of the semiconductor integrated circuit 1001 does not increase when a power source capacitor is provided in the entire or a portion of the power source capacitor forming region 1004, the power source capacitor forming region 1007, and the power source capacitor forming region 1008.

Conventional semiconductor integrated circuits have a structure equivalent to that of when a power source capacitor is provided adjacent to a standard cell provided in the semiconductor integrated circuit. Therefore, the power source capacitor is provided in the conventional power source capacitor forming region 1016. A current flowing from the power source capacitor provided in the conventional power source capacitor forming region 1016 to the P-channel functional transistor provided in the P-channel functional transistor forming region 1002 in the standard cell 1011, is reduced due to the power source wiring line resistance 1017. However, in the tenth example, the power source capacitor is provided closer to the P-channel functional transistor provided in the P-channel functional transistor forming region 1002 in the standard cell 1011 than to the conventional power source capacitor forming region 1016, so that the power source wiring line resistance 1018 is smaller than the power source wiring line resistance 1017. Therefore, the power source wiring line resistance can be reduced as compared to the power source wiring line resistance 1017 between the functional transistor and the power source capacitor, thereby making it possible to effectively suppress the peak IR-Drop.

Also in the tenth example, similar to the ninth example, a power source capacitor can be provided while avoiding an increase in the area.

Note that, in the foregoing description of the tenth example, a power source capacitor is formed in a region in a standard cell in which only a functional transistor is formed, after arrangement of the standard cell, for the sake of simplicity. For example, also in a standard cell 1013 in which only an N-channel transistor is formed, a standard cell 1014 in which only a P-channel transistor is formed, or a non-rectangular standard cell 1015, a power source capacitor can be similarly provided in at least one of an N-channel transistor region opposing a P-channel functional transistor forming region in a P-channel transistor region and a P-channel transistor region opposing an N-channel functional transistor forming region in the N-channel transistor region.

ELEVENTH EXAMPLE

Next, a semiconductor integrated circuit according to an eleventh example of the present invention will be described with reference to FIG. 11.

Figure 11:
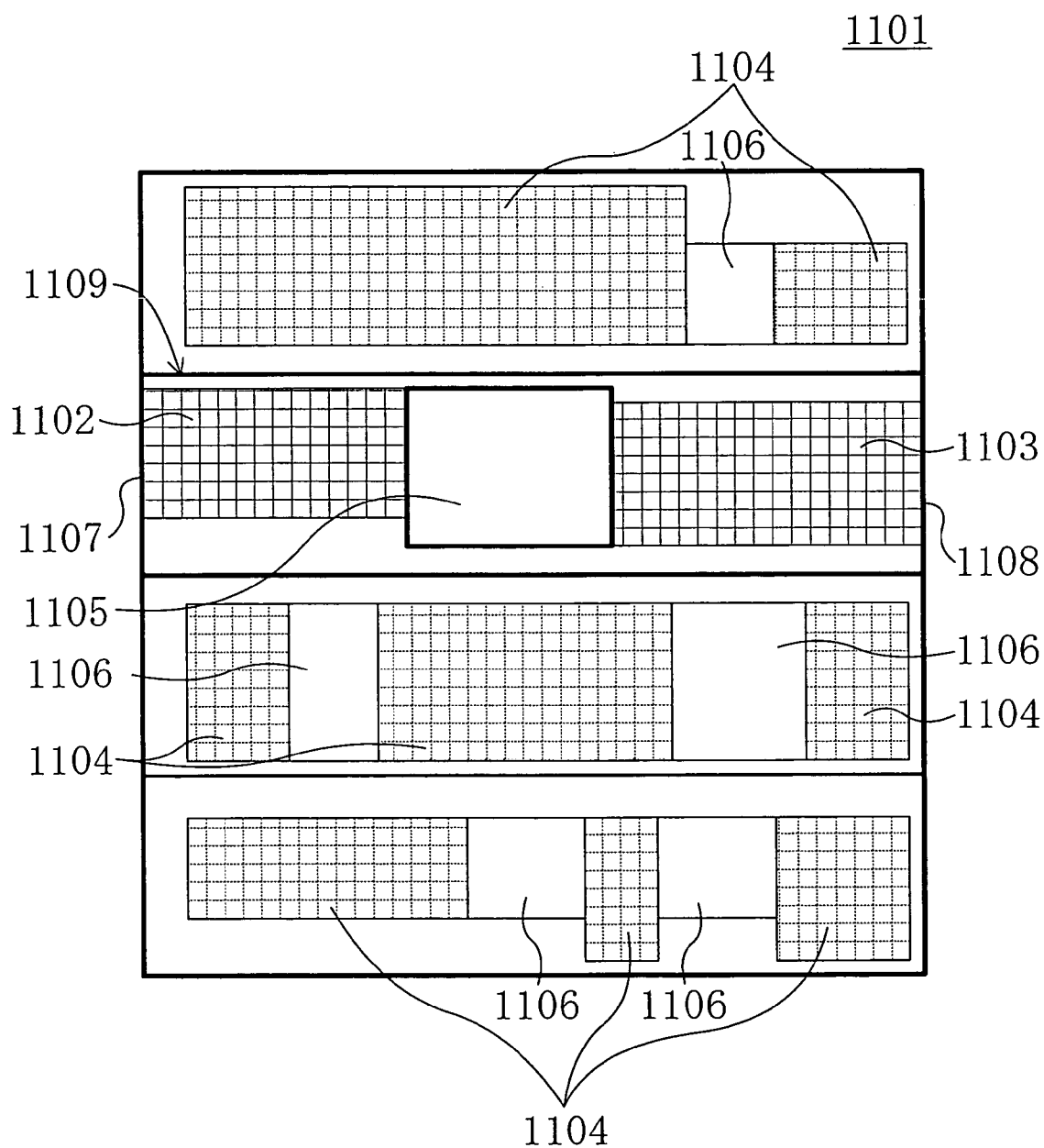
FIG. 11 is a structural diagram illustrating a semiconductor integrated circuit according to an eleventh example of the present invention.

In FIG. 11, 1101 indicates a semiconductor integrated circuit, 1109 indicates a transistor region constituting the semiconductor integrated circuit 1101, 1102 and 1103 each indicate a functional transistor forming region in the transistor region 1109, 1104 indicates functional transistor forming regions in transistor regions other than the transistor region 1109, 1105 indicates a power source capacitor forming region of the transistor region 1109 in which a power source capacitor is formed, and 1106 indicates another power source capacitor forming region other than the transistor region 1109 in which a power source capacitor is formed. In the semiconductor integrated circuit 1101, a power source capacitor is formed in the entire or a portion of the power source capacitor forming region 1105 and the power source capacitor forming region 1106.

The thus-constructed semiconductor integrated circuit will be hereinafter described. The semiconductor integrated circuit 1101 includes the functional transistor forming regions 1102 and 1103 and the other functional transistor forming regions 1104 to form functional transistors. A left-hand side of the size in the horizontal direction of the semiconductor integrated circuit 1101 is determined, depending on a left-hand end portion 1107 of the transistor region 1109, and a right-hand side thereof is determined, depending on a right-hand end portion 1108 of the transistor region 1109. Therefore, when a power source capacitor is provided in the power source capacitor forming region 1105 or 1106 which is located on a farther right-hand side than the functional transistor forming region 1102, the left-hand end portion 1107 does not increase in any transistor region, so that the semiconductor integrated circuit 1101 does not extend in a left-hand horizontal direction. Similarly, when a power source capacitor is provided in the power source capacitor forming region 1105 or 1106 which is located on a farther left-hand side than the functional transistor forming region 1103, the right-hand end portion 1108 does not increase in any transistor region, so that the semiconductor integrated circuit 1101 does not extend in a right-hand horizontal direction. In other words, when a power source capacitor is provided in the power source capacitor forming region 1105 between the functional transistor forming regions 1102 and 1103, or a power source capacitor is provided in the other power source capacitor forming region 1106, the area of the semiconductor integrated circuit 1101 does not increase.

An effect of the tenth example caused by possessing the above-described structure will be described with reference to FIG. 15B. The semiconductor integrated circuit 1511 of FIG. 15B in which a conventional standard cell is provided has a structure equivalent to that in which the power source capacitor forming region 1513 is provided outside the standard cell. Therefore, when the power source capacitor unformed region 1514 is provided between the standard cell 1517 and the standard cell 1518, both the functional transistor in the standard cell 1517 and the functional transistor in the standard cell 1518 adjacent thereto are provided vertically opposing the power source capacitor unformed region 1514*b*, so that a power source capacitor cannot be provided. By contrast, in the tenth example, a power source capacitor can be provided in the power source capacitor unformed region 1514*b* between the functional transistors.

Referring to FIG. 11, in the case of conventional techniques, a power source capacitor needs to be provided outside the semiconductor integrated circuit 1101 since the functional transistor region 1104 is provided in regions vertically opposing each other across the power source capacitor forming region 1105. By contrast, in the eleventh example, the power source capacitor provided in the power source capacitor forming region 1105 is located between the functional transistor forming regions 1102 and 1103. Thereby, it is possible to form a power source capacitor using a smaller area of a semiconductor integrated circuit than that of conventional techniques.

Also in the eleventh example, similar to the ninth example, a power source capacitor can be provided while avoiding an increase in the area.

Note that, even when a power source capacitor is provided in the power source capacitor forming region 1106 between the functional transistor forming regions 1104 of the transistor regions other than the transistor region 1109, the power source capacitor does not exceed beyond the left-hand end or the right-hand end of the functional transistor forming regions 1102 and 1103, which determines the size in the horizontal direction of the semiconductor integrated circuit, thereby avoiding an increase in the area of the semiconductor integrated circuit 1101.

TWELFTH EXAMPLE

Next, a semiconductor integrated circuit according to a twelfth example of the present invention will be described with reference to FIG. 12.

Figure 12:
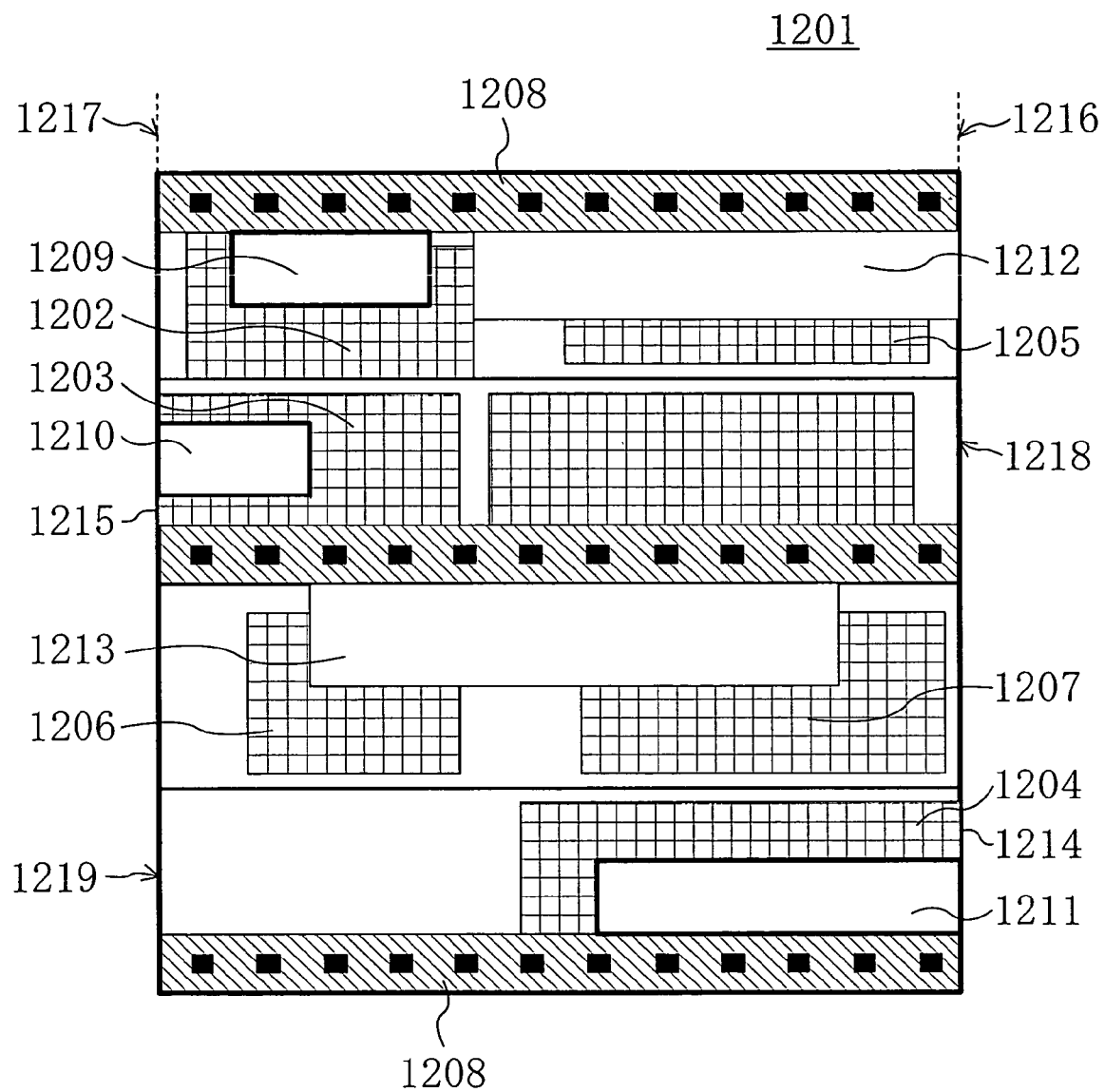
FIG. 12 is a structural diagram illustrating a semiconductor integrated circuit according to a twelfth example of the present invention.
Figure 13:
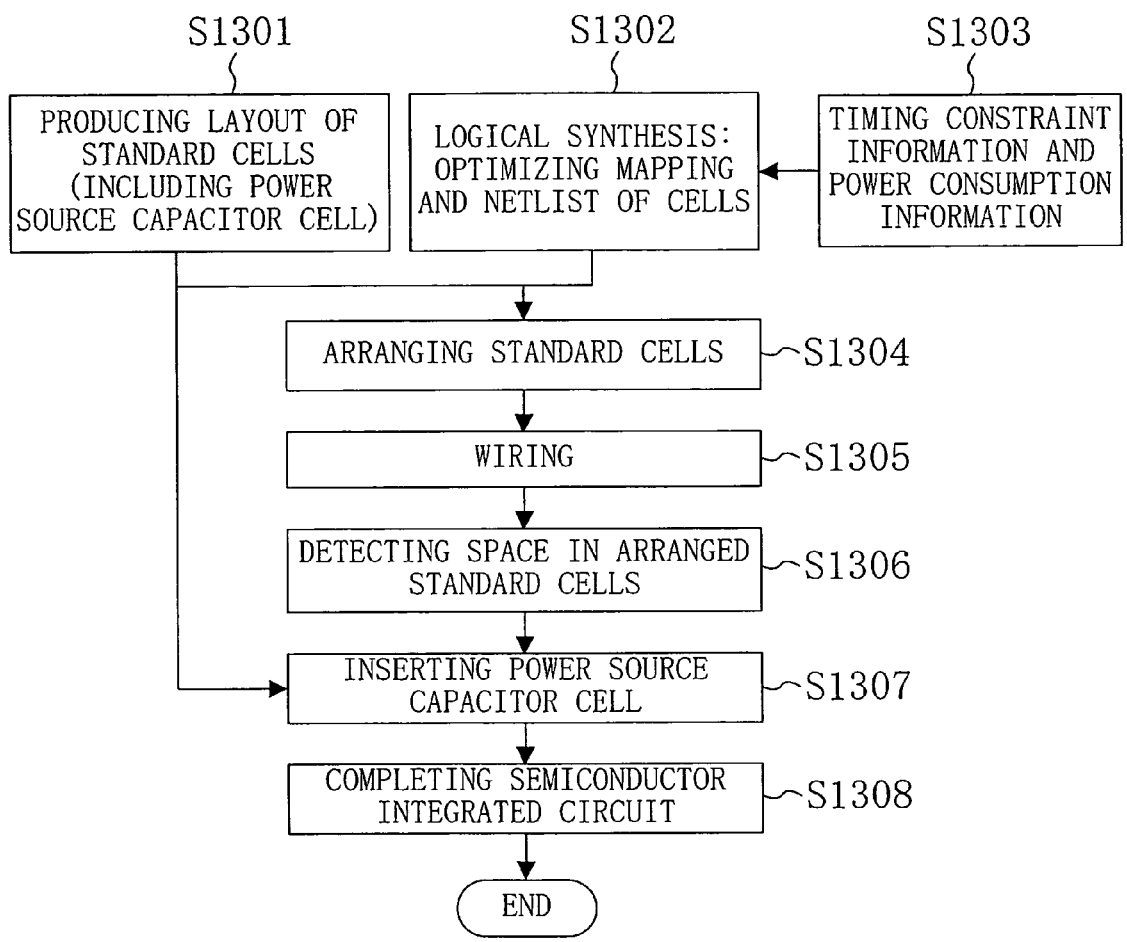
FIG. 13 is a flow chart of a conventional automatic placing and routing method.
Figure 14A:
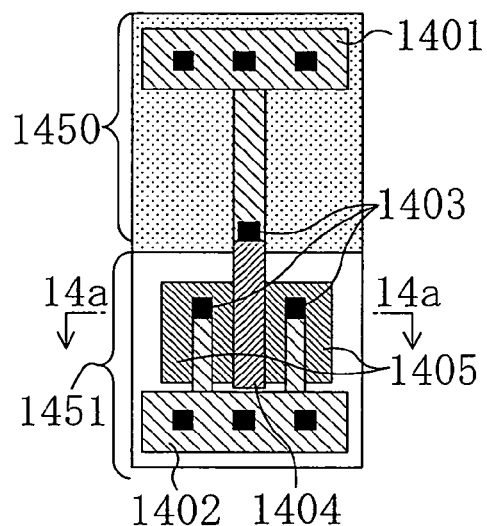
FIG. 14A is a structural diagram illustrating a conventional power source capacitor structure using an N-channel transistor.
Figure 14B:
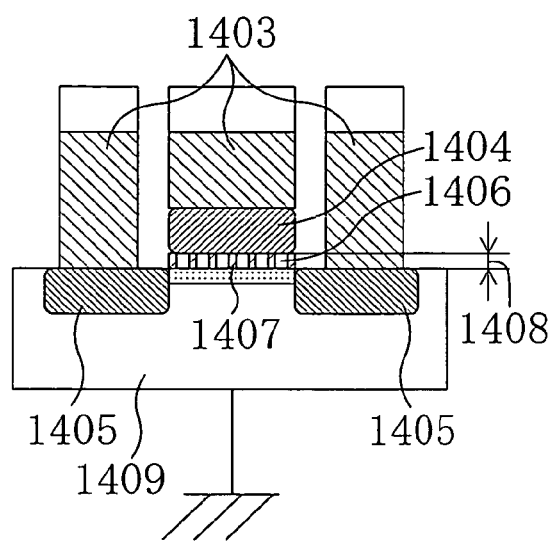
FIG. 14B is a cross-sectional view of the power source capacitor of FIG. 14A.
Figure 14C:
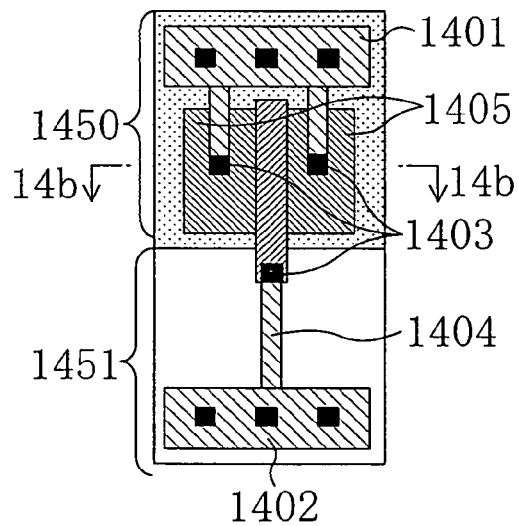
FIG. 14C is a structural diagram illustrating a conventional power source capacitor structure using a P-channel transistor.
Figure 14D:
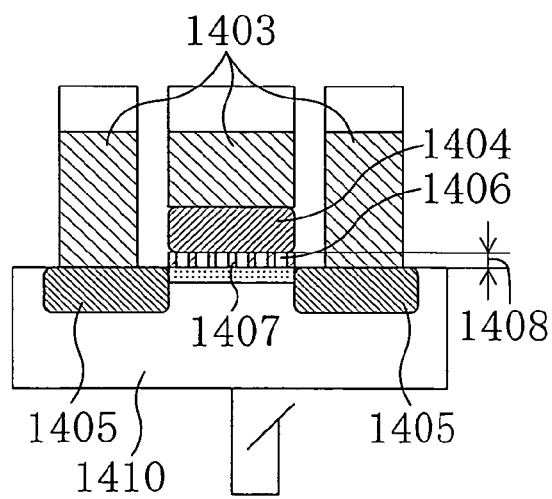
FIG. 14D is a cross-sectional view of the power source capacitor of FIG. 14C.

In FIG. 12, 1201 indicates a semiconductor integrated circuit which is composed of a standard cell 1218 and a standard cell 1219. 1202 to 1207 each indicate a functional transistor forming region in which a functional transistor is formed. The functional transistor forming regions 1202, 1203, and 1205 are included in the standard cell 1218, while the functional transistor forming regions 1204, 1206, and 1207 are included in the standard cell 1219.

Further, in the standard cell 1218, the functional transistor forming regions 1202 and 1205 are provided in a transistor region of the same type, which is different from a transistor region including the functional transistor forming region 1203. In the standard cell 1219, the functional transistor forming regions 1206 and 1207 are provided in a transistor region of the same type, which is different from a transistor region including the functional transistor forming region 1204.

1209 to 1213 each indicate a power source capacitor forming region in which a power source capacitor is formed. The power source capacitor forming region 1209 is formed in a space region surrounded by a substrate contact forming region 1208 and the functional transistor forming region 1202. The power source capacitor forming region 1210 is formed in a space region in the functional transistor forming region 1203. The power source capacitor forming region 1211 is formed in a space region surrounded by the substrate contact forming region 1208 and the functional transistor forming region 1204. The power source capacitor forming region 1212 is formed in a space region surrounded by the substrate contact forming region 1208 and the functional transistor forming region 1205. The power source capacitor forming region 1213 is formed in a space region surrounded by the substrate contact forming region 1208, the functional transistor forming region 1206, and the functional transistor forming region 1207. A power source capacitor is formed in the entire or a portion of the power source capacitor forming regions 1209 to 1213.

1214 indicates a right-hand end portion of the functional transistor forming region 1204, 1215 indicates a left-hand end portion of the functional transistor forming region 1203, 1216 indicates a right-hand end portion of the semiconductor integrated circuit 1201, and 1217 indicates a left-hand end portion of the semiconductor integrated circuit 1201.

The thus-constructed the semiconductor integrated circuit 1201 will be hereinafter described. The semiconductor integrated circuit 1201 is composed of the functional transistor forming regions 1202 to 1207 and the substrate contact forming region 1208. The left-hand end portion 1217 of the size in the horizontal direction of the semiconductor integrated circuit 1201 is determined, depending on the left-hand end portion 1215 of the functional transistor forming region 1203, and the right-hand end portion 1216 is determined, depending on the right-hand end portion 1214 of the functional transistor forming region 1204. Therefore, when a power source capacitor is provided in the power source capacitor forming region 1209 which is a space region surrounded by three sides of an concave portion the non-rectangular functional transistor forming region 1202 and a bottom side of the substrate contact forming region 1208 (a total of four sides), the size in the horizontal direction of the semiconductor integrated circuit 1201 does not increase. Similarly, since the left-hand end portion 1217 of the semiconductor integrated circuit 1201 is determined, depending on the left-hand end portion 1215 of the functional transistor forming region 1203, when a power source capacitor is provided in the power source capacitor forming region 1210 which is a space region surrounded by three sides of a concave portion of the non-rectangular functional transistor forming region 1203 and the left-hand end side of the semiconductor integrated circuit 1201 (a total of four sides), the size in the horizontal direction of the semiconductor integrated circuit 1201 does not increase. The right-hand end portion 1216 of the semiconductor integrated circuit 1201 is determined, depending on the right-hand end portion 1214 of the functional transistor forming region 1204. Therefore, when a power source capacitor is provided in the power source capacitor forming region 1211 which is a space region surrounded by two sides of a concave portion of the non-rectangular functional transistor forming region 1204, a top side of the substrate contact forming region 1208, and the right-hand end portion 1216 of the semiconductor integrated circuit 1201 (a total of four sides), the size in the horizontal direction of the semiconductor integrated circuit 1201 does not increase. As described above, when a power source capacitor is provided in the power source capacitor forming regions 1209 to 1213, which are space regions other than the functional transistors interposed between the left-hand end portion 1215 of the region determining the size in the horizontal direction of the semiconductor integrated circuit 1201 and the right-hand end portion 1214 of the functional transistor forming region 1204, the size in the horizontal direction of the semiconductor integrated circuit 1201 does not increase.

An effect of the twelfth example caused by possessing the above-described structure will be described. Even when a functional transistor has a non-rectangular shape, the present invention is applicable. A power source wiring line through which a power source potential or a ground potential is supplied to a functional transistor is provided in a layer on the substrate contact forming region 1208. Therefore, when a power source capacitor is provided in all or at least one of the power source capacitor forming regions 1209 to 1213 in the vicinity of the substrate contact forming region 1208, a power source wiring line connecting the power source wiring line present in the layer on the substrate contact forming region 1208 and the power source capacitor is shorter than when the power source wiring line is not provided in the vicinity of the substrate contact forming region 1208. Therefore, a power source wiring line resistance from a power source capacitor to a functional transistor is reduced, thereby enhancing the effect of reducing the IR-Drop of a standard cell.

Also in the twelfth example, similar to the ninth example, a power source capacitor can be provided while avoiding an increase in the area.

Note that, when a power source capacitor is provided in the power source capacitor forming region 1212 surrounded by a portion of the right-hand side of the functional transistor forming region 1202, a portion of the top side of the functional transistor forming region 1205, and a portion of the bottom side of the substrate contact, the size in the horizontal direction of the semiconductor integrated circuit 1201 does not increase. The 5 present invention can be applied to a semiconductor integrated circuit surrounded by such separate functional transistor forming regions and substrate contact forming regions.

What is claimed is:
1. A standard cell comprising:
a P-channel functional transistor forming region in which a plurality of P-channel functional transistors are formed;
an N-channel functional transistor forming region in which a plurality of N-channel functional transistors are formed; and
a power source capacitor forming region in which a plurality of power source capacitor elements are formed; wherein
the N-channel functional transistor forming region is adjacent to the power source capacitor forming region in a first direction;
the power source capacitor forming region is not adjacent to the P-channel functional transistor forming region in the first direction; and
the N-channel functional transistor forming region and the power source capacitor forming region are adjacent to the P-channel functional transistor forming region in a second direction perpendicular to the first direction, in plane view.
2. The standard cell of claims 1, wherein
each of the plurality of power source capacitor elements is formed between a gate electrode of an N-channel MOS transistor having the same structure as that of the functional transistor and a substrate thereof, and a potential reverse to the substrate potential is applied to the gate electrode.
3. The standard cell of claim 2, wherein
a potential of at least one of a source region and a drain region of the N-channel MOS transistor included in the plurality of power source capacitor elements is the same as the substrate potential.
4. The standard cell of claim 2, wherein
a source region of each of the plurality of N-channel functional transistors which is at the edge of the N-channel functional transistor forming region and is adjacent to the power source capacitor forming region, is applied as a source region or a drain region of the N-channel MOS transistor which is at the edge of the power source capacitor forming region and is adjacent to the N-channel functional transistor forming region.
5. The standard cell of claim 1, wherein
at least one of connection wiring lines formed between a power source wiring line through which a power source potential or a ground potential is supplied to the standard cell and a gate electrode, a source electrode and a drain electrode of a N-channel MOS transistor included in the plurality of power source capacitor elements and having the same structure as that of the functional transistor is provided perpendicular to the power source wiring line.
6. The standard cell of claim 1, wherein
the standard cell is for use in LSI design using automatic placing and routing.
7. A standard cell comprising:
a P-channel functional transistor forming region in which a plurality of P-channel functional transistors are formed;
an N-channel functional transistor forming region in which a plurality of N-channel functional transistors are formed; and a power source capacitor forming region in which a plurality of power source capacitor elements are formed wherein the P-channel functional transistor forming region is adjacent to the power source capacitor forming region in a first direction;

the power source capacitor forming region is not adjacent to the N-channel functional transistor forming region in the first direction; and the P-channel functional transistor forming region and the power source capacitor forming region are adjacent to the N-channel functional transistor forming region in a second direction perpendicular to the first direction, in plane view.

8. The standard cell of claim 7, wherein each of the plurality of power source capacitor elements is formed between a gate electrode of a P-channel MOS transistor having the same structure as that of the functional transistor and a substrate thereof and a potential reverse to the substrate potential is applied to the gate electrode.

9. The standard cell of claim 8, wherein a potential of at least one of a source region and a drain region of the P-channel MOS transistor included in the plurality of power source capacitor elements is the same as the substrate potential.

10. The standard cell of claim 8, wherein a source region of each of the plurality of P-channel functional transistors which is at the edge of the P-channel functional transistor forming region and is adjacent to the power source capacitor forming region, is applied as a source region or a drain region of the P-channel MOS transistor which is at the edge of the power source capacitor forming region and is adjacent to the P-channel functional transistor forming region.

11. The standard cell of claim 7, wherein at least one of connection wiring lines formed between a power source wiring line through which a power source potential or a ground potential is supplied to the standard cell and a gate electrode, a source electrode, and a drain electrode of a P-channel MOS transistor included in the plurality of power source capacitor elements and having the same structure as that of the functional transistor is provided perpendicular to the power source wiring line.

12. The standard cell of claim 7, wherein the standard cell is for use in LSI design using automatic placing and routing.

* * * * *